United States Patent
Illek et al.

(10) Patent No.: US 7,109,527 B2
(45) Date of Patent: Sep. 19, 2006

(54) SEMICONDUCTOR CHIP FOR OPTOELECTRONICS AND METHOD FOR PRODUCTION THEREOF

(75) Inventors: Stefan Illek, Donaustauf (DE); Andreas Plössl, Regensburg (DE); Klaus Streubel, Laaber (DE); Walter Wegleiter, Nittendorf (DE); Ralph Wirth, Regensburg (DE)

(73) Assignee: Osram GmbH, Munich (DE)

( * ) Notice: Subject to any disclaimer, the term of this patent is extended or adjusted under 35 U.S.C. 154(b) by 0 days.

(21) Appl. No.: 10/344,308

(22) PCT Filed: Aug. 8, 2001

(86) PCT No.: PCT/DE01/03033

§ 371 (c)(1),
(2), (4) Date: Jun. 20, 2003

(87) PCT Pub. No.: WO02/13281

PCT Pub. Date: Feb. 14, 2002

(65) Prior Publication Data

US 2004/0084682 A1 May 6, 2004

(30) Foreign Application Priority Data

Aug. 8, 2000 (DE) .................. 100 38 671
Nov. 30, 2000 (DE) .................. 100 59 532

(51) Int. Cl.
*H01L 33/00* (2006.01)
*H01L 21/00* (2006.01)

(52) U.S. Cl. .............. 257/95; 257/98; 438/40; 438/43

(58) Field of Classification Search .......... 257/95, 257/98; 438/29, 39, 40
See application file for complete search history.

(56) References Cited

U.S. PATENT DOCUMENTS 3,813,587 A * 5/1974 Umeda et al. .......... 257/79
4,039,890 A * 8/1977 Bailey et al. ........... 313/500

(Continued)

FOREIGN PATENT DOCUMENTS

DE     1 589 099       3/1970

(Continued)

OTHER PUBLICATIONS

*Patent Abstracts of Japan* for Japanese 06268252 of Sep. 22, 1994.

(Continued)

*Primary Examiner*—Anh Duy Mai
(74) *Attorney, Agent, or Firm*—Cohen, Pontani, Lieberman & Pavane

(57) ABSTRACT

A semiconductor chip, particularly a radiation-emitting semiconductor chip, comprises an active thin-film layer in which a photon-emitting zone is formed, and a carrier substrate for the thin-film layer is arranged at a side of the thin-film layer faces away from the emission direction and is connected to it. At least one cavity via which a plurality of mesas is fashioned at the boundary between carrier substrate and thin-film layer is fashioned in the active thin-film layer proceeding from the carrier substrate.

31 Claims, 17 Drawing Sheets

U.S. PATENT DOCUMENTS

| | | | |
|---|---|---|---|
| 5,008,718 A | 4/1991 | Fletcher et al. | |
| 5,087,949 A | 2/1992 | Haitz | |
| 5,376,580 A | 12/1994 | Kish et al. | |
| 5,491,350 A | 2/1996 | Unno et al. | |
| 6,091,085 A | 7/2000 | Lester | |
| 6,111,272 A | 8/2000 | Heinen | |
| 6,229,160 B1 * | 5/2001 | Krames et al. | 257/94 |
| 2001/0000209 A1 | 4/2001 | Krames et al. | |
| 2002/0009238 A1 * | 1/2002 | Bird | 382/312 |

FOREIGN PATENT DOCUMENTS

| | | |
|---|---|---|
| DE | 27 16 205 | 11/1977 |
| DE | 198 07 758 | 12/1998 |
| DE | 199 11 717 | 9/2000 |
| EP | 0 022 486 | 1/1981 |
| EP | 0 319 907 | 6/1989 |
| EP | 0 544 512 | 6/1993 |
| EP | 0 905 797 | 3/1999 |
| GB | 1553783 * | 10/1979 |
| GB | 2 326 023 | 12/1998 |
| JP | 406151955 * | 5/1994 |
| WO | WO 01/41219 | 6/2001 |

OTHER PUBLICATIONS

*Patent Abstracts of Japan* for Japanese 06318731 of Nov. 15, 1994.

M.R. Krames, et al., "High-power truncated-inverted-pyramid $(Al_xGa_{1-x})_{0.5}In_{0.5}P/GaP$ light-emitting diodes exhibiting >50% external quantum efficiency", Applied Physics Letter, vol. 75, No. 16, pp. 2365-2367, Oct. 1999.

R. Windisch et al., "High-efficiency non-resonant cavity light-emitting diodes", Electronics Letters, vol. 34, No. 11, pp. 1153-1154, May 28, 1998.

W.N. Carr et al., "One-Watt GaAs *p-n* Junction Infrared Source", Applied Physics Letters, vol. 3, No. 10, pp. 173-175, Nov. 15, 1963.

"Nova Flares LEDs", Internet web page, Jun. 7, 1999.

* cited by examiner

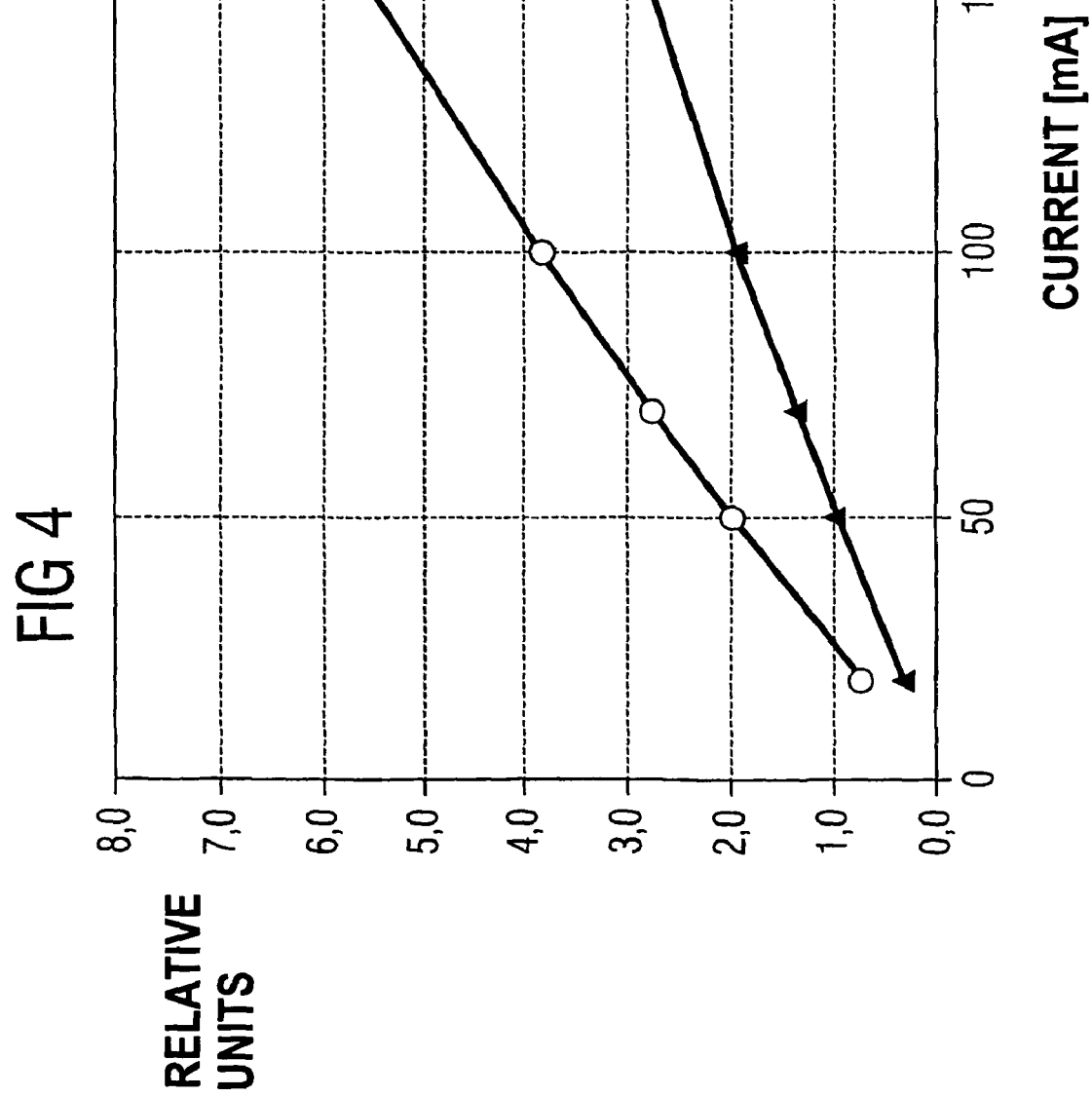

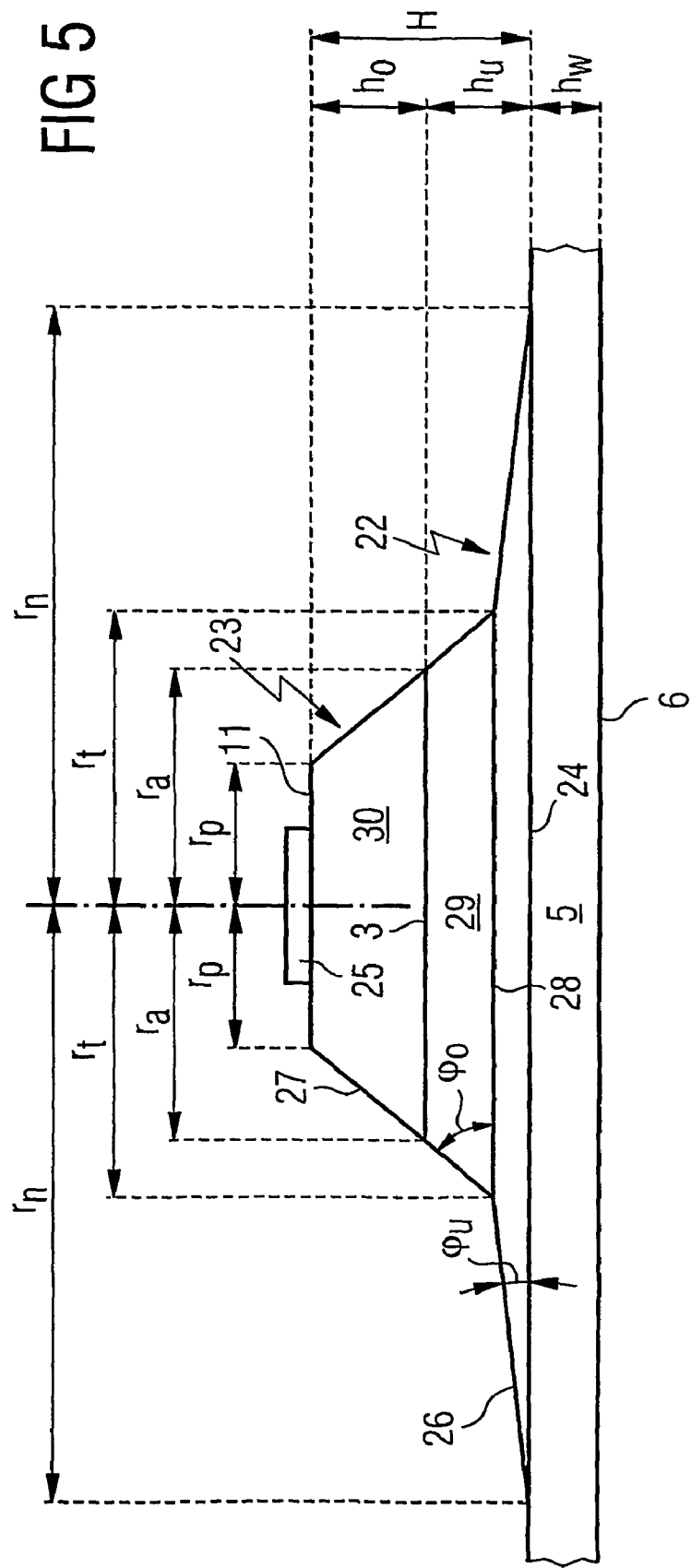

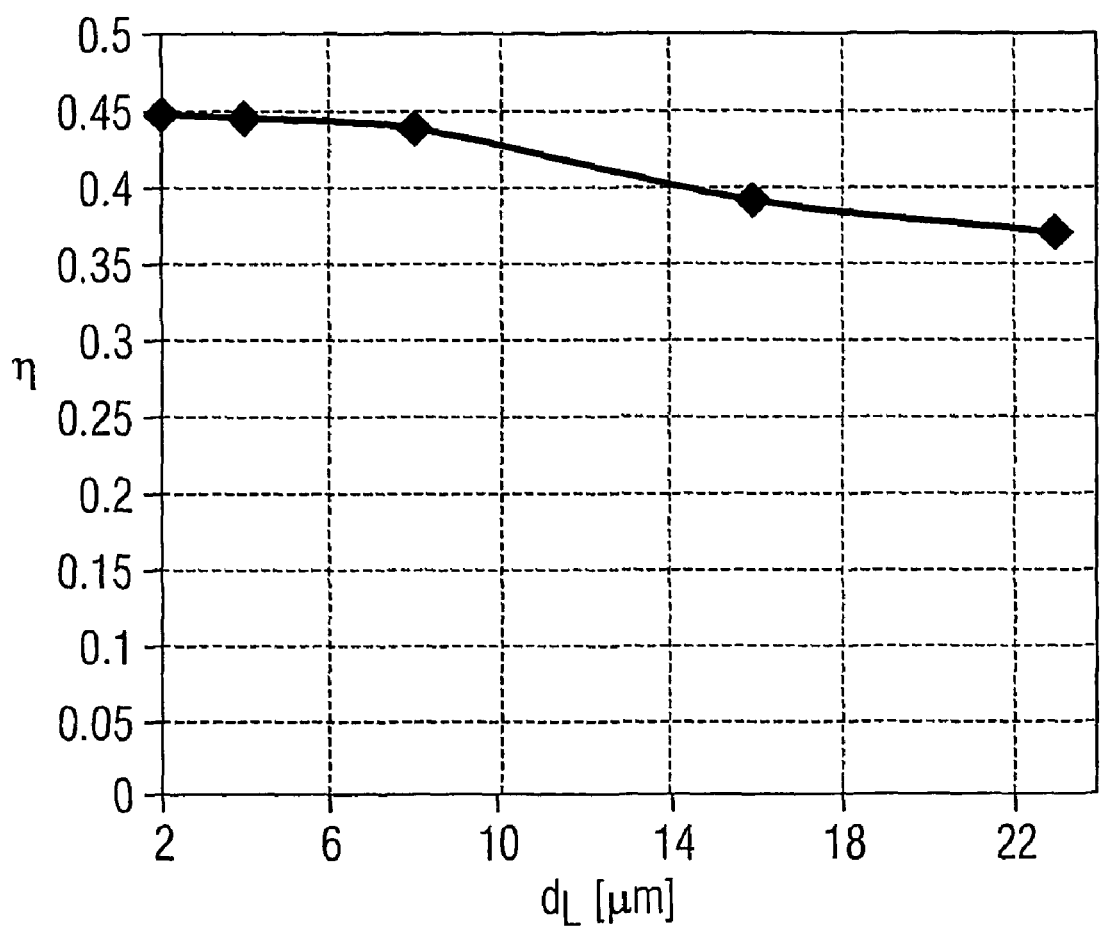

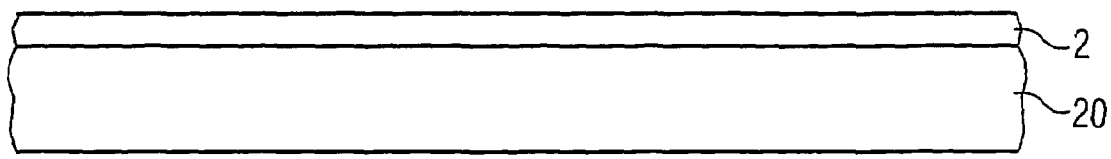
FIG 17a
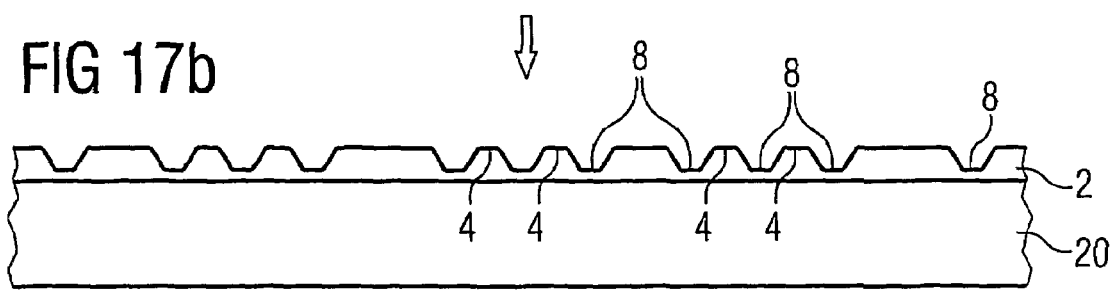
FIG 17b
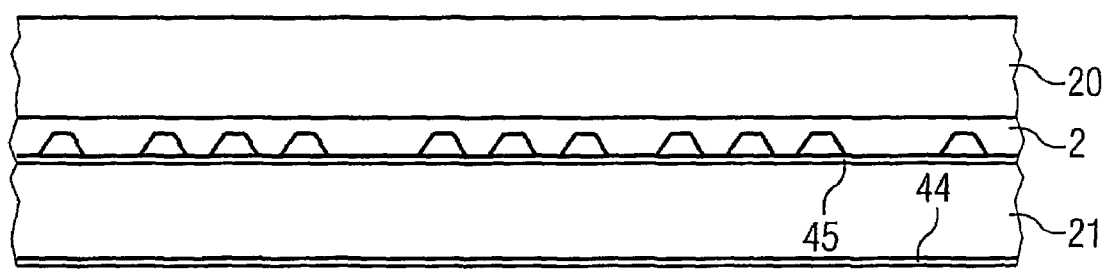
FIG 17c
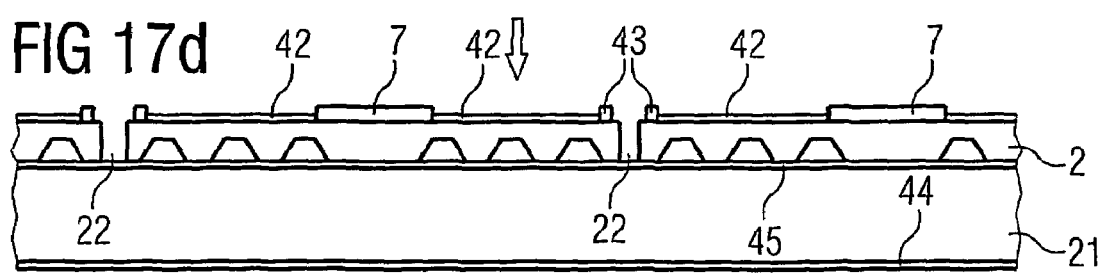
FIG 17d
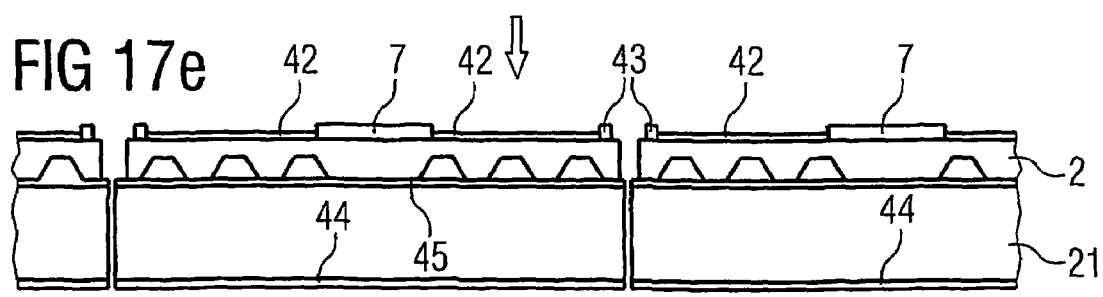
FIG 17e

FIG 18a
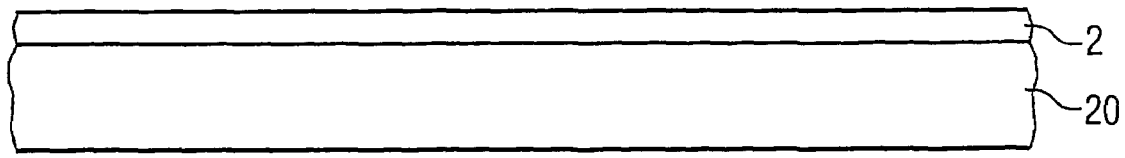
FIG 18b
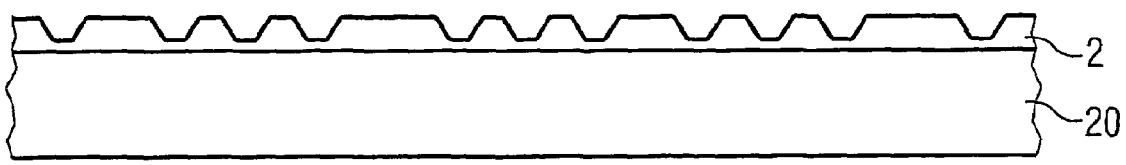
FIG 18c
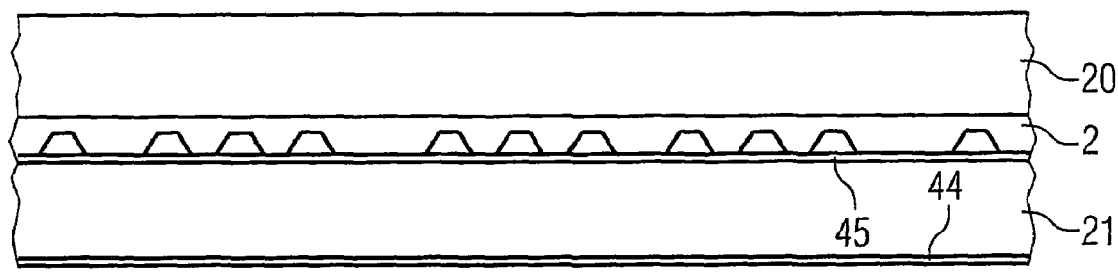
FIG 18d
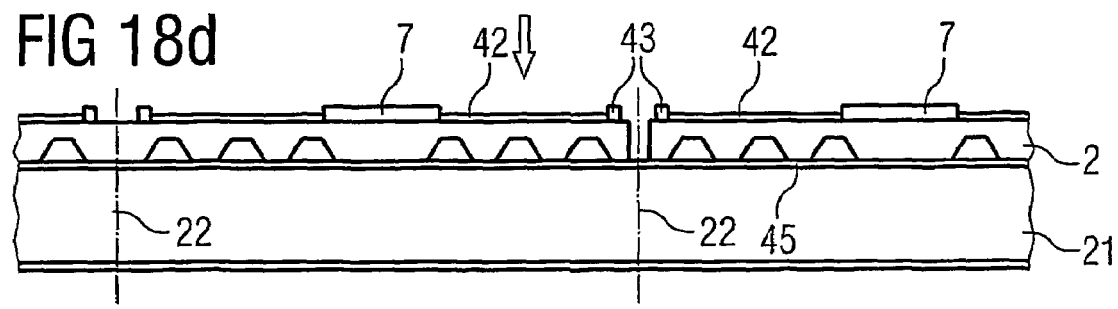
FIG 18e
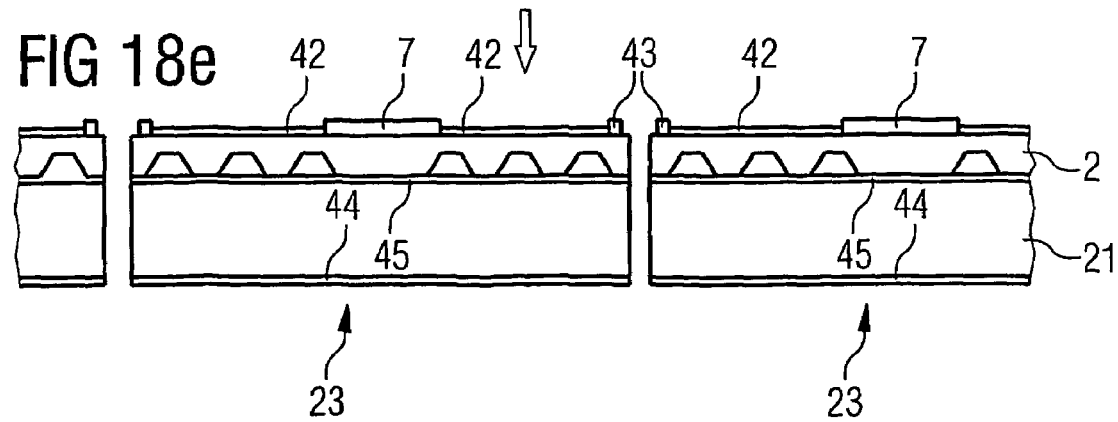

SEMICONDUCTOR CHIP FOR OPTOELECTRONICS AND METHOD FOR PRODUCTION THEREOF

RELATED APPLICATIONS

This is a U.S. national stage of International Application No. PCT/DE01/03033 filed on Aug. 8, 2001.

BACKGROUND OF THE INVENTION

1. Field of the Invention

The invention is directed to a semiconductor chip for optoelectronics, particularly a radiation-emitting semiconductor chip, comprising:

an active thin-film layer, particularly on the basis of $In1_{-x-y}Al_xGa_yP$ (whereby $0 \leq x \leq 1$, $0 \leq y \leq 1$ and $x+y \leq 1$ apply), in which a photon-emitting zone is formed, and a carrier substrate for the thin-film layer that is arranged at a side of the thin-film layer that faces away from the emission direction and that is connected to it.

It is also directed to a method for the simultaneously manufacture of a plurality of such semiconductor chips.

2. Description of the Related Art

The carrier substrate is part of the semiconductor chip in and of itself and mechanical support for the thin-film layer, which itself no longer comprises a self-supporting layer at that side lying opposite the carrier substrate.

Thin-film layer on the basis of $In_{1-x-y}Al_xGa_yP$ (where $0 \leq x \leq 1$, $0 \leq y \leq 1$ and $x+y \leq 1$ apply) means that the thin-film layer comprises a plurality of layers that are manufactured of doped or undoped material from the system $In_{1-x-y}Al_xGa_yP$ (where $0 \leq x \leq 1$, $0 \leq y \leq 1$ and $x+y \leq 1$).

Semiconductor chips of the species initially cited are disclosed by U.S. Pat. Nos. 5,008,718 and 5,367,580. For manufacturing a semiconductor chip of the known type, an active semiconductor layer sequence is usually applied on a substrate using an epitaxy process. Subsequently, a carrier substrate is secured on the upper side of the active semiconductor layer sequence. The substrate on which the semiconductor layer sequence had been deposited is at least partially removed.

A metallic reflection layer is advantageously situated between the carrier substrate and the active semiconductor layer sequence, so that no light is absorbed by the carrier substrate.

One disadvantage of the known semiconductor chip is that the metallic reflection layer arranged between carrier substrate and the active semiconductor layer sequence generally does not comprise a satisfactory reflectivity given short wavelengths. Gold becomes more and more inefficient as a metallic reflection layer, particularly at a wavelength of less than 600 nm, since the reflectivity significantly decreases. For example, the elements Al and Ag, whose reflectivity remains comparatively constant at wavelengths shorter than 600 nm, can be employed at wavelengths below 600 nm.

The bonding of large surfaces like the metallic reflection layer are currently problematic. The bonding and the alloying of the metallic contact layer also results in a considerable risk for a deterioration of the quality of the metallic reflection layer.

German patent document DE 198 07 758 A1 also discloses a semiconductor shaped like a truncated pyramid that comprises an active, light-emitting zone between an upper window layer and a lower window layer. Together, the upper window layer and the lower window layer form a base body having the shape of a truncated pyramid. The result of the slanting alignment of the sidewalls of the window layers is that the light emanating from the active zone is totally reflected at the lateral surfaces and impinges the base surface of the truncated pyramid base body serving as luminous surface at nearly a right angle. As a result, a part of the light emitted by the active zone emerges onto the surface within the exit cone of the semiconductor element.

The "exit cone" is defined as the cone that is formed by light rays whose angle of incidence onto the exit face is less than the critical angle for the total reflection and that are therefore not totally reflected but directly coupled out from the semiconductor material. The aperture angle of the exit cone, consequently, is twice as large as the limit angle of the total reflection. Those light rays that proceed outside of the exit cone, i.e., impinge the exit face at an angle larger than the limit angle of the total reflection, are totally reflected.

In order to achieve a significant increase in the light yield, this concept assumes a minimum thickness for the upper and lower window layer. Given the known truncated pyramid semiconductor element, the thickness of the upper and lower window layer amounts to at least 50.8 µm (0.002 inches). Such a layer thickness is still doable. When, however, the power of the known semiconductor chip is to be increased, then it is necessary that all dimensions be scaled. This results in layer thicknesses that can only be manufactured with high outlay in an epitaxial way. If it can be scaled at all, then this known semiconductor chip can only be scaled with great technical outlay.

SUMMARY OF THE INVENTION

The invention is based on the object of providing a semiconductor chip manufacturable in thin-film technology that has an improved light output and in providing a method for the manufacture thereof.

This object is achieved by a semiconductor chip for a radiation-emitting optoelectronics semiconductor chip, comprising: an active thin-film layer comprising a photon-emitting (active) zone; a carrier substrate for the thin-film layer that is arranged at a side of the thin-film layer that faces away from an emission direction and that is connected to the thin-film layer; and at least one cavity; and a plurality of mesas formed in part by the at least one cavity; the plurality of mesas being fashioned at a boundary between the carrier substrate and thin-film layer; and the at least one cavity being fashioned in the active thin-film layer proceeding from the carrier substrate.

This object is also achieved by a method for a simultaneous manufacture of a plurality of semiconductor chips for optoelectronics having an active thin-film layer in which an active zone that emits photons is formed, comprising: growing, epitaxially, a layer sequence on a growth substrate wafer, the layer sequence containing a zone that emits the photons; fashioning at least one cavity in the layer sequence such that a plurality of mesas arise in the layer sequence; applying at least one insulating layer onto a surface of the layer sequence provided with the cavities; manufacturing at least respectively one through-contact on the mesas; applying a formed wafer union composed of growth substrate wafer and layer sequence onto a carrier substrate wafer such that the mesas face toward the carrier substrate wafer; connecting the wafer union to the carrier substrate wafer; at least partially removing the growth substrate wafer; applying an electrical contacting onto that side of the layer sequence lying opposite the mesas; and separating the wafer union composed of carrier substrate wafer and structured layer sequence along parting tracks to form semiconductor chips.

DESCRIPTION OF THE DRAWINGS

Further advantageous developments of the inventive semiconductor chip and of the inventive method derive from the exemplary embodiments described below in combination with the drawings.

FIG. 4 is a graph that shows the increase in the light yield given the semiconductor chips according to the invention compared to traditional semiconductor chips;

FIG. 5 is a schematic illustration of a cross-sectional profile of a mesa that is composed of a lower, flat conoidal frustum and an upper, step conoidal frustum;

FIG. 9 is a graph showing the relationship between output efficiency and size of a luminous spot in the active zone;

FIGS. 17a–17e is a schematic illustration of sequence of a first method for the manufacture of a plurality of semiconductor chips according to the invention;

FIGS. 18a–18e is a schematic illustration of sequence of a second method for the manufacture of a plurality of semiconductor chips according to the invention;

Identical component parts or component parts having the same effect are provided with the respectively same reference characters in the Figures.

DETAILED DESCRIPTION OF THE PREFERRED EMBODIMENTS

Figure 1:
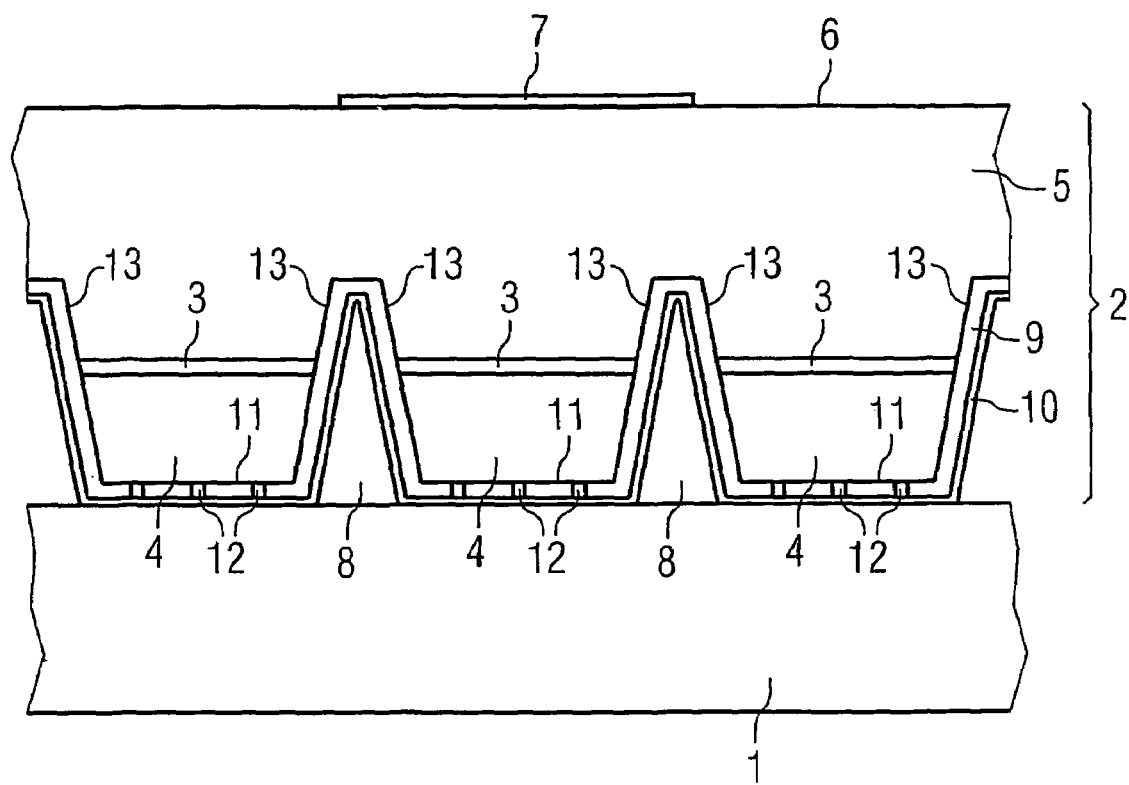
FIG. 1 is a schematic illustration of a cross-section through a semiconductor chip according to the invention.

Various preferred embodiments of the invention are considered briefely below. In an especially preferred embodiment of the semiconductor chip, the cross-section of the cavity decreases from the outside to the inside, i.e., from the boundary to the carrier substrate toward the inside of the thin-film layer, and the depth of the cavity amounts to more than half the thickness of the thin-film layer.

The advantageous effect of the cavity or the plurality of mesas produced by the cavity is that the thin-film layer comprises contact pressure layers at its connecting side toward the carrier substrate that are small in area compared to the overall cross-sectional area of the chip. This yields the advantage that a comparatively high local pressure can be generated in the region of the smaller contact pressure surfaces—this is required for a dependable joining of carrier substrate and thin-film layer—but that, simultaneously, the pressure on the thin-film layer can be keep sufficiently low in order to optimally preclude damage to the thin-film layer when it is joined to the carrier substrate.

On the other hand, the available connection surface is enlarged due to the cavity, which can likewise lead to an improvement in the connection between carrier substrate and thin-film layer. Moreover, the cavity is available for the acceptance of excess adhesive or solder material, which advantageously makes their dosing less critical.

The cavity also advantageously creates lateral surfaces at which a part of the radiation emitted by the active zone is deflected such that, within the exit cone, it impinges that exit face of the active thin-film layer that faces away from the carrier substrate. Compared to the Prior Art, the reflection at the lateral surfaces of the mesas given the semiconductor chip of the invention at least partly occurs at the location of the reflection at a continuous, planar reflection layer.

It is advantageous when the lateral surfaces project as deeply as possible into the thin-film layer, so that an optimally great part of the radiation emitted by the active zone that is not directly incident onto the exit face and coupled out at this face is reflected such (potentially even multiply) that it impinges the exit face with an angle that lies within the exit cone.

Investigations show that the outfeed efficiency increases greatly when the depth of the cavity is greater than half the thickness of the thin-film layer.

Given an embodiment of the invention, the cavity is so deep that the active zone of the active thin-film layer is parted by it.

It has been shown that semiconductor chips whose active zone is interrupted by a cavity introduced into the active thin-film layer proceeding from the fastening side exhibit an especially high light yield. In this case, namely, it is not only the photons emitted toward the fastening side but also at least some of the photons emitted toward the exit face of the active thin-film layer that are redirected due to reflection at the lateral surfaces of mesas into an angle relative to the exit face that lies within the exit cone.

The reflection at the boundary surface of the mesas results in a large part of the photons emitted by the active zone being incident onto the exit face within the exit cone and thus can leave the semiconductor chip.

In another preferred embodiment, the thin-film layer is fashioned such that at least one trajectory of the photons emitted by the active zone leads from the respective mesa to one of the neighboring mesas.

As a result of the optical coupling of the mesas, photons that have not been reflected at one of the lateral surfaces of the original mesa can proceed into one of the neighboring mesas and are reflected such at the lateral surfaces of the respective mesa that they impinge the exit face within the exit cone.

In an advantageous development of the invention, further, the mesas are equipped with concave lateral surfaces.

As a result of these measures, rays that are initially reflected at the exit face become steeper and steeper relative to the exit face with every further reflection at a lateral surface of a mesa, so that they ultimately impinge the exit face within the exit cone.

In another preferred embodiment, the mesas are covered with a reflection layer.

As a result of this measure, all light rays incident onto the lateral surface of the mesas are steered in the direction onto the exit side of the semiconductor chip.

Referring to the specific details shown in the drawings, the semiconductor chip shown in FIG. 1 for a light-emitting diode comprises a carrier substrate 1 on which the active thin-film layer 2 is applied. For the sake of clarity, the thickness of the active thin-film layer 2 is shown exaggerated in FIG. 1 compared to the thickness of the carrier substrate 1. The active thin-film layer 2 comprises a photon-emitting, active zone 3 that is respectively fashioned at a mid-height in mesas 4. The mesas 4 can be fashioned like a truncated pyramid or a conoidal frustum. The semiconductor chip thus represents a light-emitting diode.

The mesas 4 are arranged at a cover layer 5 that comprises a central, front-side contact location 7 on a flat front side 6 that is preferably formed by a metallization layer. The back-side mesas 4 formed by cavities 8 are covered with a reflection layer that is composed of a dielectric insulation layer 9 a metallization layer 10 applied on it. The insulation layer 9 is interrupted by through-contacts 12 formed by metallized sections along a base area 11 of the mesas 4.

The insulation layer preferably has a lower refractive index than the adjoining semiconductor layer of the thin-film layer 2. It is also fashioned as a diffusion barrier for the metallization layer 10. An electrically conductive layer can also be employed instead of the insulating layer 9. The optical properties of this layer are determinant.

For manufacturing the semiconductor chip shown in FIG. 1, the active thin-film layer 2 is first epitaxially grown on a growth substrate. The active thin-film layer 2 can, for example, be manufactured on the basis of InGaAlP. The cover layer 5 is formed first on the growth substrate and is subsequently doped with a concentration above $10^{18}$ cm$^{-3}$ in order to assure a good conductivity of the cover layer 5. A good conductivity of the cover layer 5, namely, is a prerequisite for this, that one central contact location 7 on the front side 6 of the light-emitting diode chip suffices for the supply of the active zone 3 of a plurality mesas 4 with current. Moreover, the composition of the cover layer 5 is selected such that it is transparent for the photons generated in the active zone. This can usually be accomplished via a setting of the band gap on the basis of the composition of the material of the cover layer 5.

Subsequently, a further layer is applied on the cover layer 5, the mesas 4 being formed in this further layer with suitable wet-chemical or dry-chemical etching processes. Such etching processes are known and are not the subject matter of this disclosure. The mesas 4 are preferably fashioned only in the regions provided for the semiconductor chips and are in turn preferably formed only in the regions wherein the light ouffeed can occur, i.e., not under contact layers 7, 43 and 49 on the upper side of the thin-film layer 2. The regions provided for the semiconductor chips typically have lateral dimensions of, for example, 400×400 μm². The mesas 4 comprise outside dimensions that lie in the region of the layer thickness of the active thin-film layer 2. The outside dimensions of the mesas 4 therefore lie in the region of 10 μm The deposition of the insulating layer 9 on the mesas 4 and the formation of the through-contacting 12 ensues in a further method step. The metallization layer 10 is subsequently applied.

Subsequently, the active thin-film layer 2 is parted according to the intended plurality of semiconductor chips. This ensues, for example, by wet-etching.

The detached, active thin-film layers 2 are then secured to the carrier substrate 1, for example by eutectic bonding, and the growth substrate is removed by wet-etching. As a final step, the contact locations are formed on the exposed front side of the active thin-film layer 2, and the semiconductor chips are separated by parting the carrier substrate 1.

The semiconductor chip shown in FIG. 1 is advantageous in that the photons generated by the active zone 3 do not impact components of the semiconductor chip that absorb these photons. The metallization layer 10, namely, keeps the photons away from the carrier substrate 1. Accordingly, the carrier substrate can be advantageously optimized very well in view of electrical and/or thermal conductivity and/or thermal expansion.

A further advantage is that, given the semiconductor chip from FIG. 1, a majority of the photons emitted by the active zone 3 is totally reflected at lateral surfaces 13 of the mesas 4. The photons totally reflected at the lateral surfaces 13 are incident onto the front side 6 at a large angle. In particular, a part of the photons that would be totally reflected at the front side without reflection at the lateral surfaces 13 impinges the front side 6 within the exit cone and can therefore leave the semiconductor chip. Given the semiconductor according to FIG. 1, the reflection at the continuous base surface known from the Prior Art is at least partially replaced by the total reflection at the lateral surfaces. Compared to traditional semiconductor chips without cavities 8, the semiconductor chip of FIG. 1 therefore exhibits a light yield that is increased by nearly the factor of 2.

This effect is explained in detail below on the basis of the further exemplary embodiments shown in FIGS. 2 and 3.

Let a number of light rays be considered, where the term "light rays" should not be understood as a limitation to a specific wavelength but as a reference to the methods of geometrical optics, regardless of the wavelength of the electromagnetic radiation.

Figure 2:
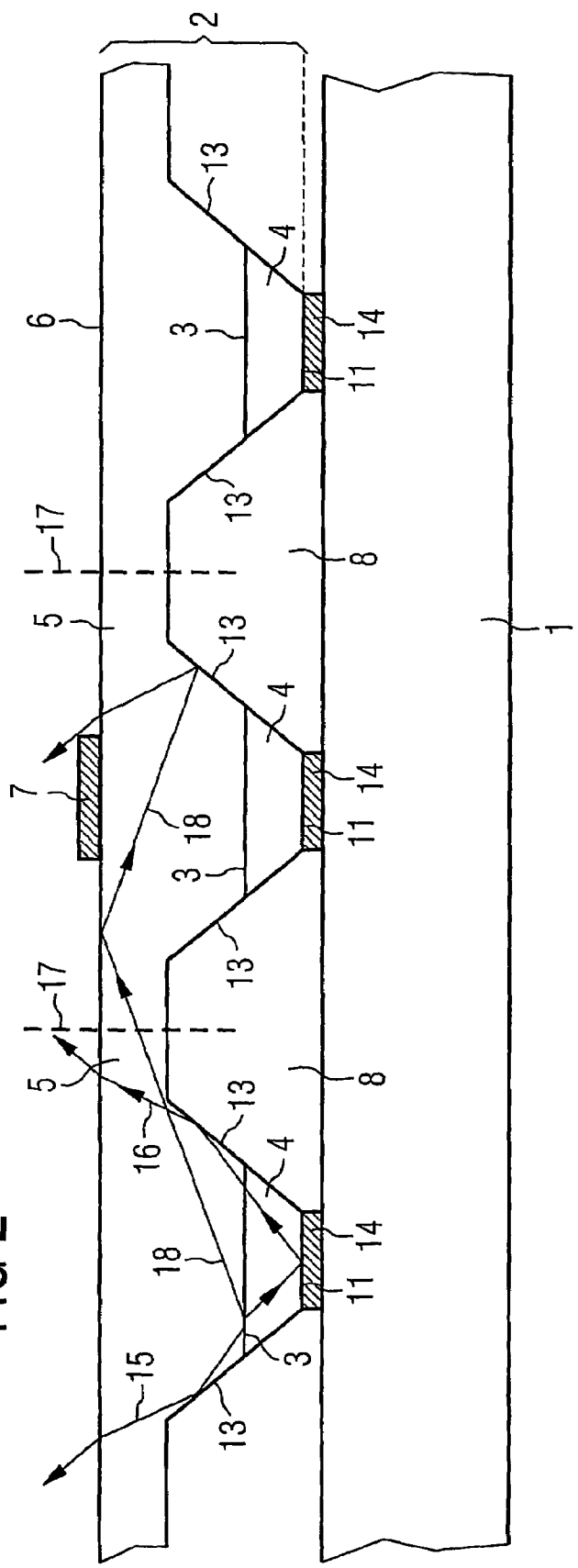
FIG. 2 is a schematic illustration of a cross-section through a further exemplary embodiment of a semiconductor chip according to the invention, in which the active zone is respectively arranged truncated pyramid-shaped mesas.

Given the exemplary embodiment shown in FIG. 2, the mesas 4 are fashioned like a truncated pyramid and are secured to the carrier substrate 1 via a contact layer 4 only at the base area 11 of the mesas 4. The active zone 3 is supplied with current by the contact layer 14.

Due to the great differences between the refractive indices of semiconductors to casting resin of, typically, 3.5 to values of, typically, 1.5, only light rays that are incident onto the boundary surface within an exit cone having an aperture angle or approximately 160 can couple out from the semiconductor at the boundary surface between semiconductor and casting resin. Given an angularly equally distributed incidence of the light rays, this corresponds to approximately 2% of the light rays incident onto a surface unit.

Due to the mesas 4, the light rays emanating from the active zone 3 are steered in the direction onto the front side 6. What the mesas 4 effect is that the light rays incident onto the lateral surfaces 13 are redirected in the direction onto the front side 6 and impinge thereat within the exit cone, so that they can leave the semiconductor chip. The light yield can be optimized using a suitable selection of the dimensions of the base area 11, of the angle of inclination of the lateral surface 13 and the height of the mesas 4 as well as the position of the active zone 3.

FIG. 2 shows a light ray 15 that is first totally reflected at the lateral surface 13 and is directed from there to the front side 6. At the front side 6, the light ray 15 impinges the boundary surface within the exit cone and can therefore leave the semiconductor chip. Without the total reflection at the lateral surface 13, the light beam 15 would have been totally reflected at the front side 6 and steered back to one of the reflection layers known from the Prior Art, where it would have been reflected again. In this respect, the reflection at the traditional, continuous reflection layer is replaced by the reflection at the lateral surfaces 13 given the exemplary embodiment shown in FIG. 2.

This is also true of a light ray 16 that is first reflected at the base surface 11 and then at the lateral surface 13. After the second reflection, the light ray 16 is also steered to the front side 6, where it is incident within the exit cone. Without the reflection at the lateral surface 13, the light ray 16 would likewise have been totally reflected at the front side 6 and steered back to a back-side reflection layer.

It is also advantageous that the mesas 4 are optically coupled via the cover layer 5. What is to be understood by optical coupling in this context is that at least one of the light rays emanating from the active thin-film layer 2 can proceed across as center line 17 from the region of one of the mesas 4 into the region of one of the neighboring mesas 4. Due to the optical coupling with the assistance of cover layer 5, namely, a light ray 18 that is not incident onto one of the lateral surfaces 13 of the respective mesas 4 can be incident onto one of the lateral surfaces 13 of one of the neighboring mesas 4 and be steered thereat to the front side 6, where it impinges within the exit cone. The light yield is therefore enhanced further due to the optical coupling via the cover layer 5.

Figure 3:
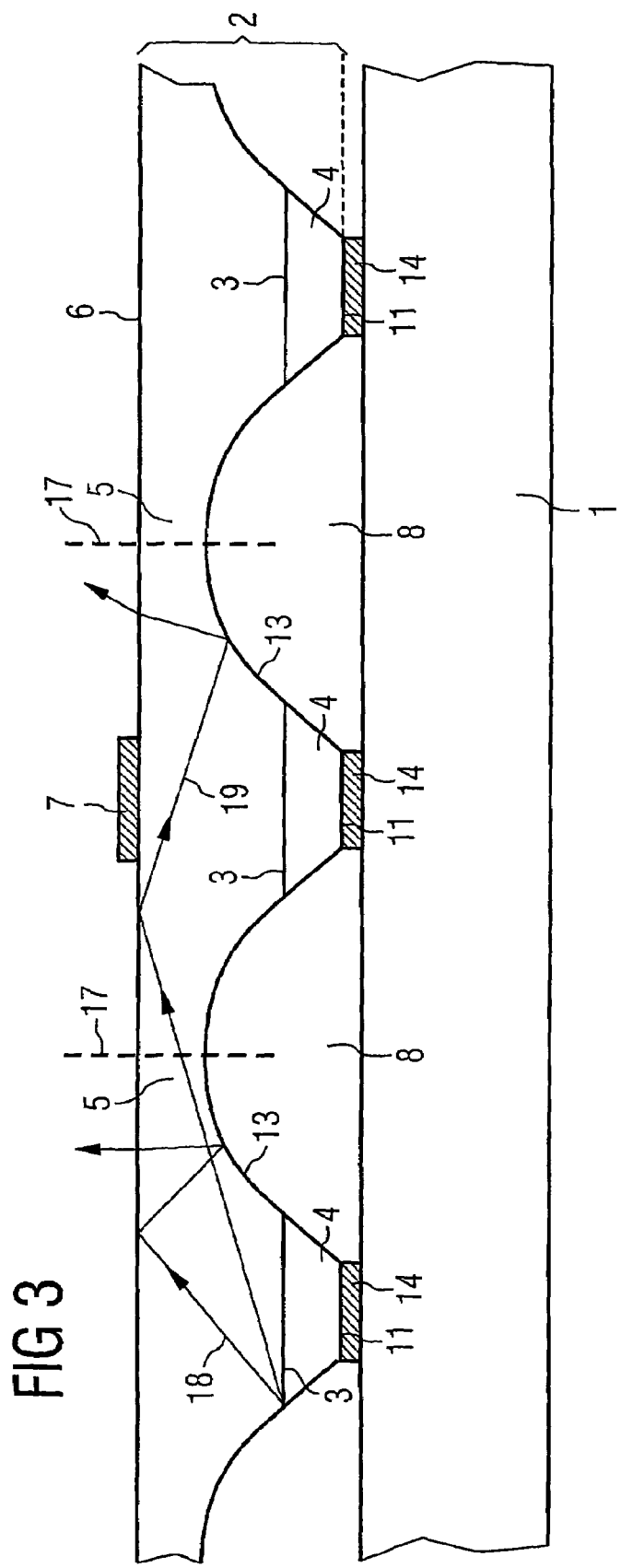
FIG. 3 is a schematic illustration of a cross-section through a semiconductor chip according to the invention that is equipped with mesas that comprise concave lateral surfaces.

FIG. 3, finally, shows a cross-section through a modified exemplary embodiment of the semiconductor chip in which the mesas 4 are fashioned like conoidal frustums with concave lateral surfaces 13. The fashioning of the lateral surfaces 13 leads to the fact that a light ray 18 reflected back and forth between the front side 6 and the lateral surface 13 is increasingly redirected to the front side given an approach to the center line 17 until it is incident onto the front side 6 within the exit cone. The same is true of light rays 19 that initially proceed via the cover layer 5 from respectively one mesa 4 to the neighboring mesa 4 and are brought thereat to the front side 6 in a large angle.

FIG. 4, finally, shows a diagram in which a measured curve 20 shows the dependency of the light yield in relative units of the operating current given pulsed operation for a traditional light-emitting diode manufactured in thin-film technology. A further measured curve 21 illustrates the dependency of the light yield in relative units dependent on the operating current for a light-emitting diode according to the exemplary embodiment shown in FIG. 3. FIG. 4 shows that the light yield given the exemplary embodiments shown in FIG. 3 is approximately double the light yield of traditional semiconductor chips without cavities 8.

A number of investigations were carried out in order to find the best shape for the mesas 4. The results of these investigations are presented in detail below on the basis of FIGS. 5 through 14.

First, let the parameters that were varied in the investigations be explained on the basis of FIG. 5. FIG. 5 shows a cross-sectional profile of one of the mesas 4. In the illustrated case, the mesa 4 is composed of a lower conoidal frustum 22 and an upper conoidal frustum 23. The lower conoidal frustum 22 has a base area 24 adjoining the cover layer 5. The active zone 3 is formed in the upper conoidal frustum 23. A contact location 25 arranged on the base area 11 of the mesa 4 is also provided in FIG. 5.

The lateral surfaces 13 of the mesas 4 are composed of a sidewall 26 of the lower conoidal frustum 22 and sidewalls 27 of the upper conoidal frustum 23. The geometrical dimensions of the lower conoidal frustum 22 along a common boundary surface 28 are selected such that the sidewall 26 merges directly into the sidewall 27.

Various dimensions of the mesa 4 are referred to below. The radius of the base area 24 of the lower conoidal frustum 22 is referenced $r_n$, the radius of the boundary surface 28 is referenced $r_t$ and the radius of the base area 11 is referenced $r_p$. Furthermore, the mesa 4 can be subdivided into a lower limiting layer 29 between the base area 24 and the active zone 3 and an upper limiting layer 30 between the active zone 3 and the base area 11. The lower limiting layer 29 comprises a height $h_u$ and the upper limiting layer 30 comprises a height $h_o$. The overall height of the mesa 4, finally, is referenced H, and was consistently set equal to 6 μm in all investigations. A value of 2 μm was selected for the thickness $h_w$ of the cover layer in all investigations in which the thickness $h_w$ was not varied.

FIGS. 6a through 6d show the result of a calculation in which the radius $r_p$ of the base area was set equal to 5 μm and the radius $r_n$ of the base area 24 was set equal to 20 μm. The radius $r_t$ of the boundary surface 28 was varied between 6 and 18 μm corresponding to the cross-sectional profiles shown in FIGS. 6a through 6c.

A refractive index of 3.2 was employed for the active zone 3 in the investigations. The refractive index of the lower limiting layer 29, of the upper limiting layer 30 as well as of the cover layer was equal to 3.3. Insofar as it was not varied, the reflectivity of the contact location 25 was employed with 0.3. The reflectivity of the base area 11 not covered by the contact location as well as of the sidewalls 26 and 27 was set to the value 0.8. "Reflectivity" is the respective coefficient of reflection referred to the energy.

Furthermore, the self-absorption of the active zone 3 was taken into consideration with an absorption coefficient of 10,000/cm. All investigations were implemented with photon recycling. An internal quantum efficiency of 0.8 was assumed for this. The quantum efficiency in the generation of photons due to charge carrier recombination was not taken into consideration. The output efficiency η indicated in the diagrams is therefore equal to the ratio of the photons coupled out from the semiconductor chip to the number of photons actually generated. The values for the indicated output efficiency η would therefore still have to be multiplied by the factor 0.8 in order to arrive at the external efficiency.

It was also assumed that the reflection at the contact location 25 and the sidewalls 26 and 27 is angle-independent. The case that the dielectric insulating layer 9 is applied first on the mesas 4 and supplemented by the mirroring metallization layer 10 therefore underestimates the reflection in the investigations in terms of its effect, since the total reflection occurring in this case was not taken into consideration in the investigations.

Figure 6D:
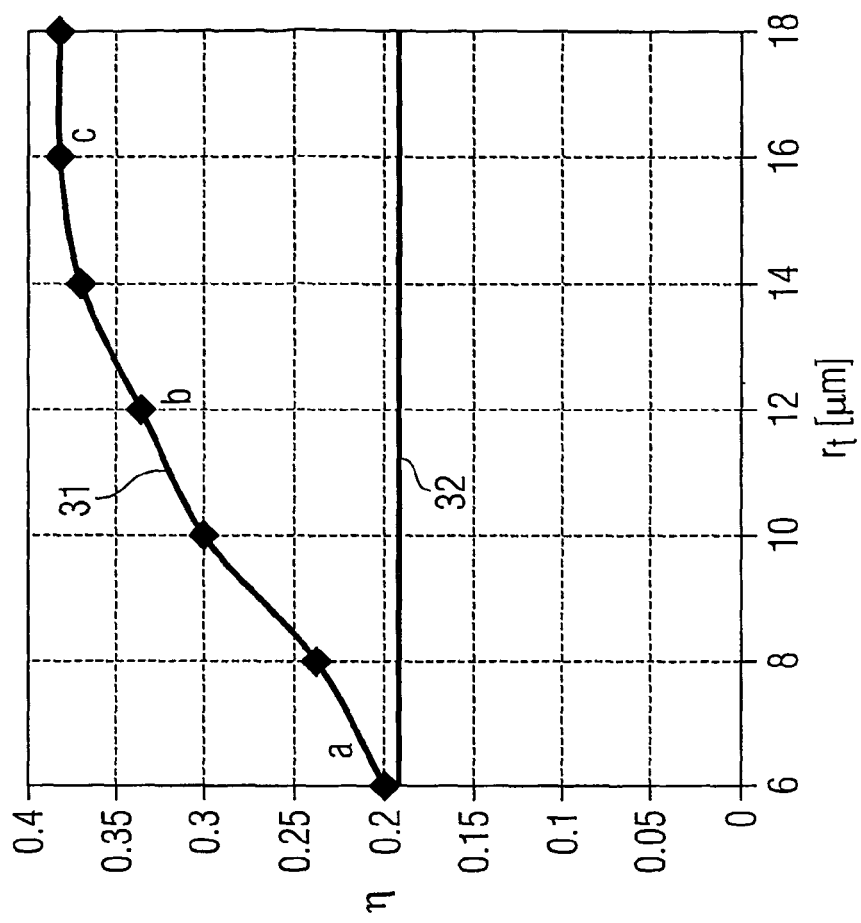
FIGS. 6a–6d are schematic illustrations of various cross-sectional profiles of mesas and a graph that shows the dependency of the output efficiency on the radius of the boundary surface between the lower truncated pyramid and the upper truncated pyramid of the mesa from FIG. 5.
Figure 6A:
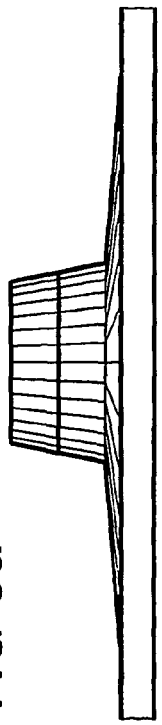
Figure 6B:
Figure 6C:
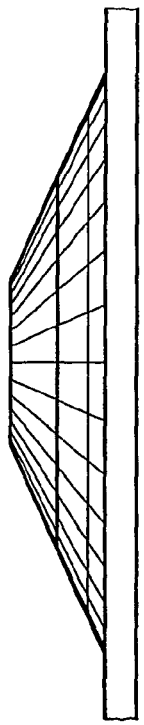

FIG. 6c shows a diagram in which the output efficiency η is entered over the radius $r_t$ in a curve 31. The output efficiency of a normal thin-film semiconductor chip is also entered for comparison, the scatter being determined only via the photon recycling. This thin-film semiconductor chip having the edge length 300 μm comprises the same epitaxial structure as the mesa 4 in the lower conoidal frustum 22 and upper conoidal frustum 23. It was assumed that the semiconductor chip is provided with a mirror at the p-side whose reflectivity amounts to 0.72. This value is the average of the reflectivity of a reflection layer and a contact layer weighted with the degree of occupancy, in which the value 0.8 was employed for the reflectivity of the reflection layer and the value 0.85 was employed for the degree of occupancy of the reflection layer and the value 0.3 for the reflectivity of the contact layer and 0.15 for the degree of occupancy was employed.

FIG. 6 shows that, given a very large angle of incidence $\phi_o$ of the upper conoidal frustum 23 according to the cross-sectional profile shown in FIG. 6a, the output efficiency η is hardly better than the output efficiency η of a traditional thin-film light-emitting diode, whose output efficiency is shown with the straight line 32 in FIG. 6d. This is also easy to understand since the mesa 4 having the flat cross-sectional profile shown in FIG. 6a hardly converts the light rays emanating from the active zone 3 into a steep angle relative to the luminous surface 6. It is precisely this, however, that the mesa 4 with the cross-sectional profile shown in FIG. 6c accomplishes, for which reason the output efficiency η in this case amounts to nearly double the output efficiency η of a traditional thin-film light-emitting diode.

Furthermore the dependency of the output efficiency η on the reflectivity of the contact location 25 was investigated. To this end, the output efficiency η was calculated dependent on the reflectivity of the contact location 25, in which the cross-sectional profile of the mesa 4 was the same as the cross-sectional profile shown in FIG. 6b. It was also assumed that the contact location 25 covers the entire base area 11.

Figure 7:
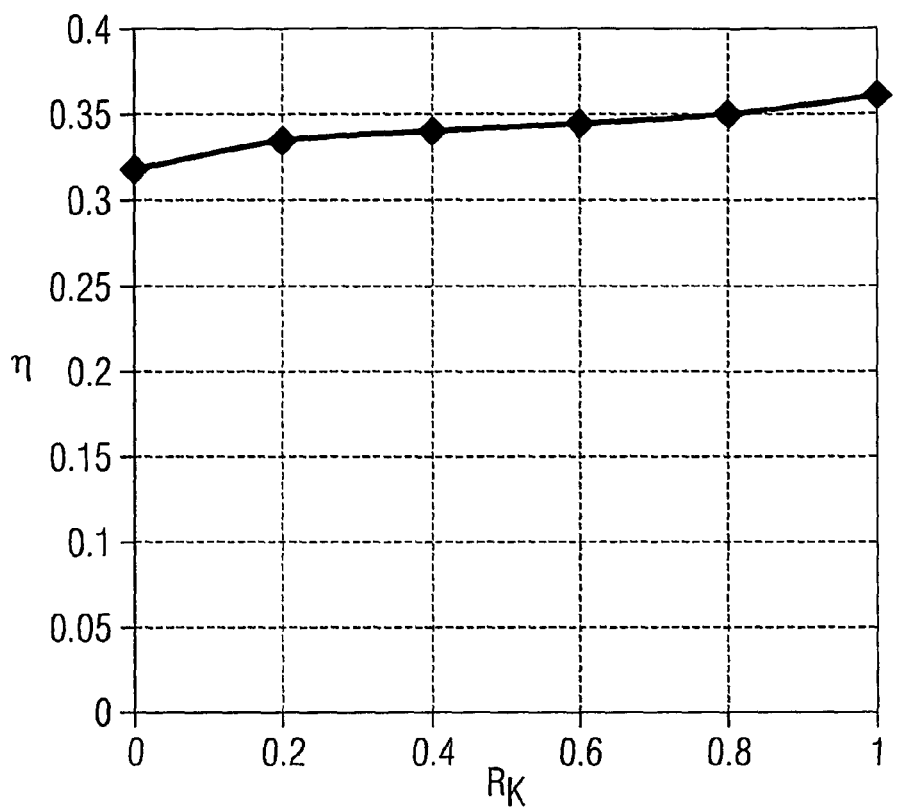
FIG. 7 is a graph that shows the dependency of the output efficiency on the reflectivity of a contact layer arranged on the peak of the mesa from FIG. 5.

FIG. 7 shows that the output efficiency η is not significantly dependent on the reflectivity of the contact location 25. The semiconductor chips described here having mesas 4 on the fastening side therefore seem to be significantly less sensitive to the poor reflectivity of the contact location than the traditional thin-film light-emitting diodes, since the multiple reflections leading to the oufeed occur only to a slight fraction between the base area 11 and the luminous surface 6 but three-dimensionally in the mesa 4.

The relative independence from the reflectivity of the contact location 25 is particularly advantageous since, in practice, a low ohmic resistance between the contact location 25 and the upper limiting layer 30 generally involves a poor reflectivity. A good ohmic contact, namely requires the diffusion of atoms from the layer forming the contact location 25 into the material lying below it.

In contrast to the dependence on the reflectivity of the contact location 25, the dependence of the output efficiency η on the reflectivity RS of the mirror surfaces on the base area 11 and the sidewalls 26 and 27 is highly pronounced. This is shown by the results of a calculation that was carried out with a model for the semiconductor chip whose mesas 4 comprise the radii $r_p$=5 μm, $r_d$=16 μm and $r_n$=20 μm.

The mesas 4 therefore roughly exhibit the cross-sectional profile shown in FIG. 6b.

Figure 8:
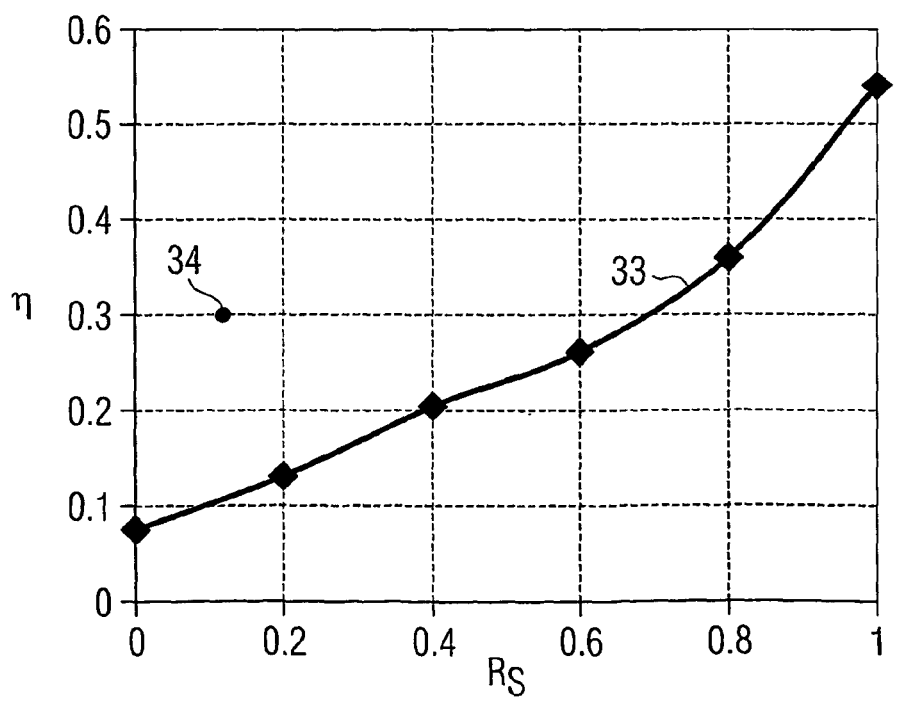
FIG. 8 is a graph in which the dependency of the output efficiency on the reflectivity of the lateral surfaces of the mesa from FIG. 5 is shown.

The result of this calculation is a curve 33 entered in FIG. 8, which monotonously rises with increasing reflectivity $R_S$. A point 34 entered in the diagram from FIG. 8 represents the result of a calculation for a semiconductor chip on which no mirror layer was applied but that was embedded in resin as surrounding medium. However, total reflection occurs here, so that a higher output efficiency derives compared to a semiconductor chip with a mirror layer. This would also be the case given the exemplary embodiment shown in FIG. 1, where the electrical insulating layer, at which total reflection can likewise occur, is arranged at the metallization layer 10.

FIG. 9 contains the result of a calculation that was carried out at a semiconductor chip having mesas 4 for whose radii the following applied: $r_p$=5 μm, $r_d$=16 μm and $r_n$=20 μm. The mesas 4 therefore essentially comprise the cross-sectional profile shown in FIG. 6. The active zone 3 was located at mid-height between the base area 24 and the base area 11. In this calculation, the region in which photons arise in the active zone was constricted to a luminous spot whose diameter $d_L$ is entered on the abscissa. It can be seen on the basis of the diagram in FIG. 9 that the output efficiency is especially high given a small luminous spot. This means that photons in the center of the active zone 3 are coupled out especially well. In this respect, a slight Weierstrass effect is present.

Figure 10D:
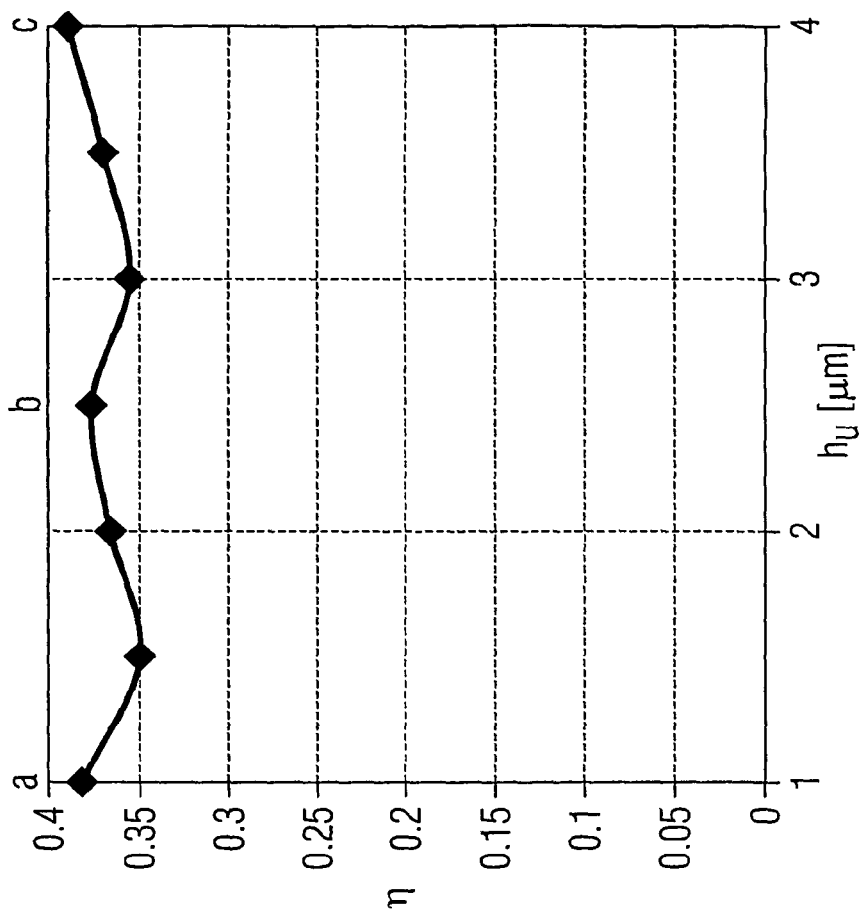
FIGS. 10a–10d are schematic illustrations of various cross-sectional profiles of a mesa in which the height of the active zone is varied, and a graph in which the output efficiency is shown dependent on the thickness of a lower limiting layer.
Figure 10A:
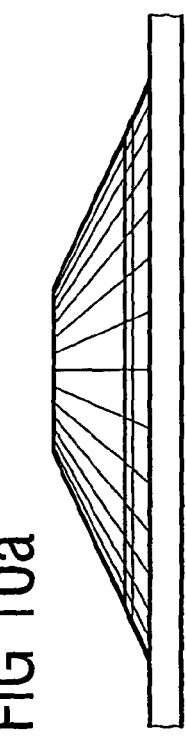
Figure 10B:
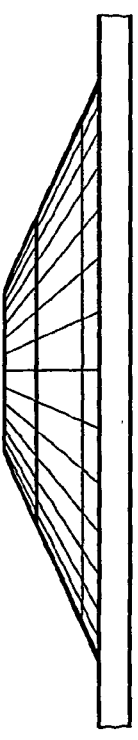
Figure 10C:

Furthermore, the influence of the position of the active zone 3 was investigated. FIGS. 10a through 10c show various cross-sectional profiles in which the thickness $h_u$ of the lower limiting layer 29 and the thickness $h_o$ of the upper limiting layer 30 were varied such that the overall height H of the mesa remained constant. The result of the calculation is shown in FIG. 10d, where the output efficiency η is entered dependent on the thickness $h_u$ of the lower limiting layer 29. It turns out that the output efficiency η is only slightly dependent on the position of the active zone 3. An active zone 3 that lies in the lower half of the mesa 4 is preferred since the current density through active zone 3 is then low and the current load on the active zone can therefore be kept low, which avoids ageing and linearity problems.

Furthermore, the influence of the angle of incidence $\phi_o$ of the sidewall 27 and of the angle of incidence $\phi_u$ of the sidewall 26 was investigated. A cross-sectional profile formed the basis in which the lower conoidal frustum 22 and the upper conoidal frustum 23 respectively comprise the same value for the angles of incidence $\phi_u$ and $\phi_o$. The radius $\phi_o$ of the active zone 3 was kept constant at 10 μm and the angle of incidence $\phi=\phi_o=\phi_u$ was varied. Two cases were considered. First the output efficiency η was investigated for the case of periodic boundary conditions, where the distance of the low end was 10 μm.

Figure 11:
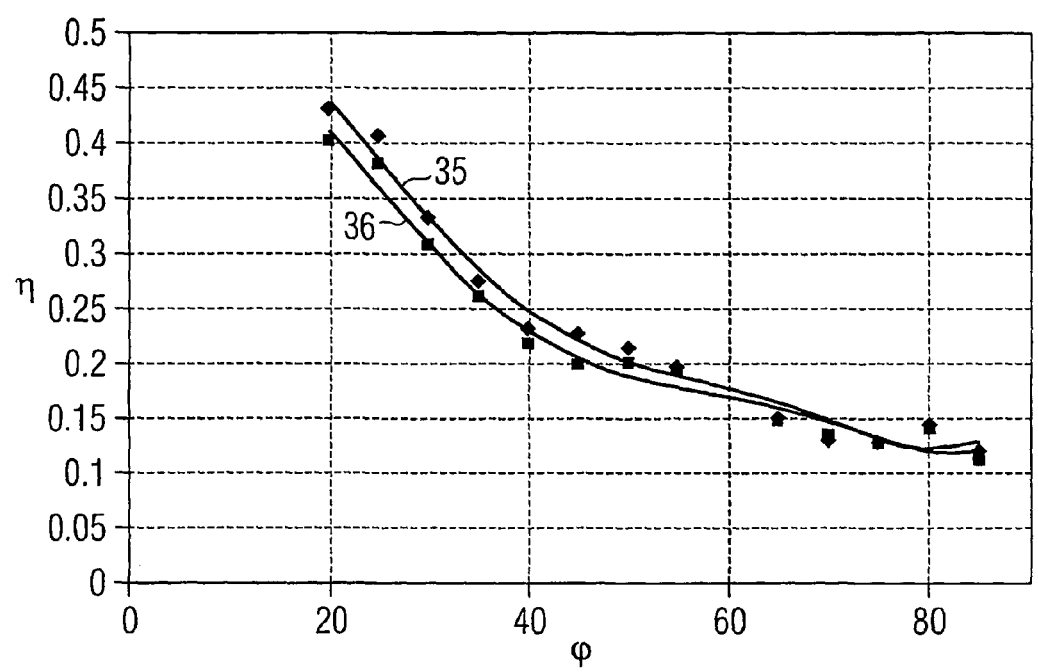
FIG. 11 is a graph that shows the dependency of the output efficiency on the sidewall angle of the lateral surfaces of a mesa having the cross-sectional profile shown in FIG. 10b.
Figure 12:
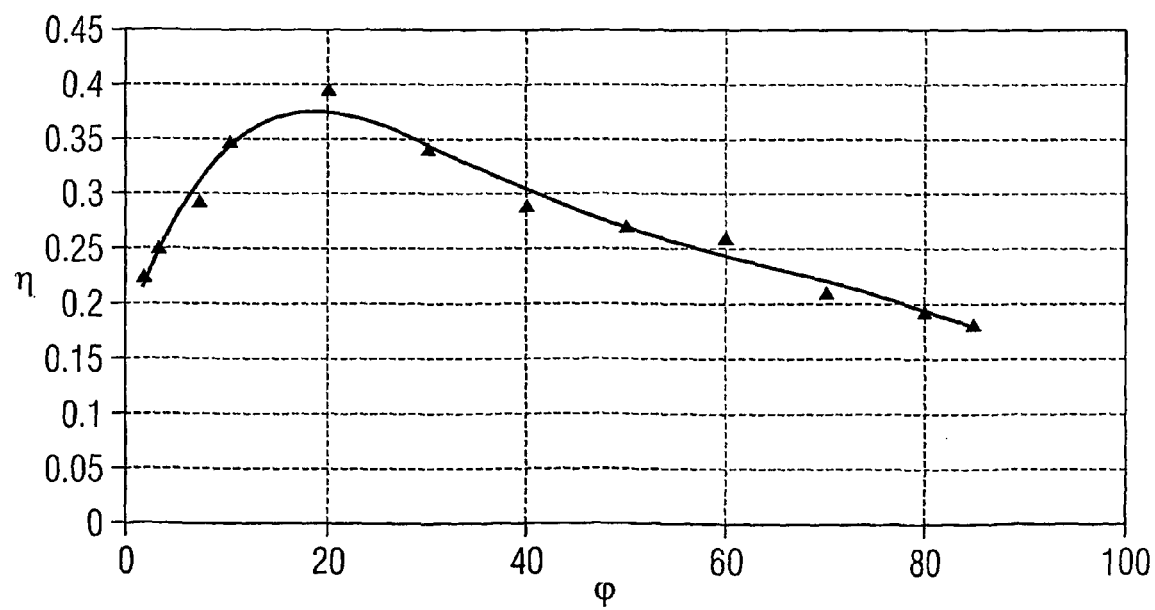
FIG. 12 is a further diagram wherein the dependency of the output efficiency on the sidewall angle of a mesa having the cross-sectional profile from FIG. 10b is shown.

The result is presented in the curve 35 in the diagram in FIG. 11. An aperiodic case was also investigated. To that end, the output efficiency η of a semiconductor chip with a single mesa 4 was calculated, in which all photons entering into the cover layer 5 are absorbed by the cover layer 5. The aperiodic case is presented by the curve 36 in FIG. 11. It can be seen from FIG. 11, that the cover layer 5 makes a noticeable contribution to the output efficiency η.

There is also an optimum range for the sidewall angle φ. This is clear on the basis of FIG. 12. In the underlying calculation, the radius $r_p$ was set equal to 10 μm. The radius $r_a$ of the active zone 3 and the radius $r_n$ of the base area 24 were varied such that the angle of incidence φ of the sidewalls 27 and 26 covers a value range between 1.5° and 85°. As can be seen from FIG. 12, there is an optimum angular range for the angle of incidence φ. The sidewall angle φ should lie between 10° and 40°. Especially good values for the output efficiency η derive when the angle of incidence φ lies between 15° and 30°.

Figure 13:
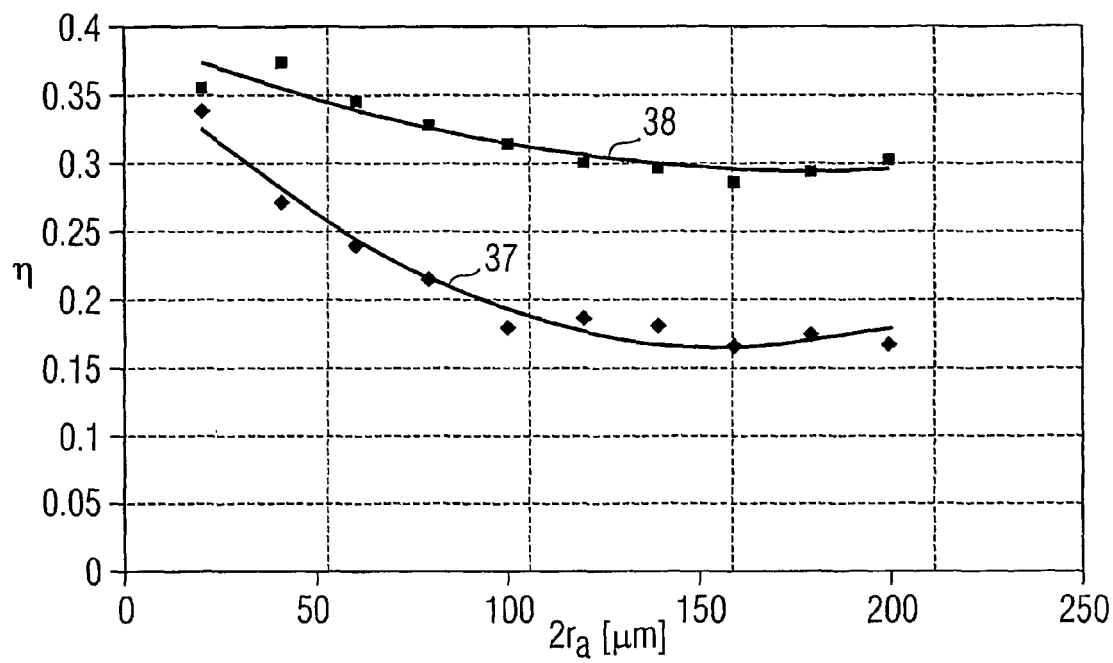
FIG. 13 is a graph that illustrates the dependency of the output efficiency on the width of the active thin-film layer given constant height.

What influence a variation of the width of the mesas 4 has on the output efficiency η was subsequently investigated. In this case, therefore, the height H of the mesas 4 was kept constant and the radii $r_p$, $r_a$ and $r_n$ were uniformly stretched. A curve 37 in FIG. 13 illustrates the case that the reflectivity RK of the contact location is equal to 0.3. A further curve relates to the case in which the reflectivity RK of the contact location 25 amounts to 0.8. Both the curve 37 as well as the curve 38 show the dependency of the output efficiency η on the diameter $2r_a$ of the active zone 3. Given good reflectivity of the contact location 25, the output efficiency η drops only slightly with increasing diameter of the active zone 3. The curve 37, which illustrates the realistic case of a poor reflectivity RK of the contact location, however, shows that the output efficiency η decreases greatly with increasing diameter of the active zone 3. The output efficiency η is therefore all the better the smaller the lateral expanse of the mesas 4 is.

Figure 14:
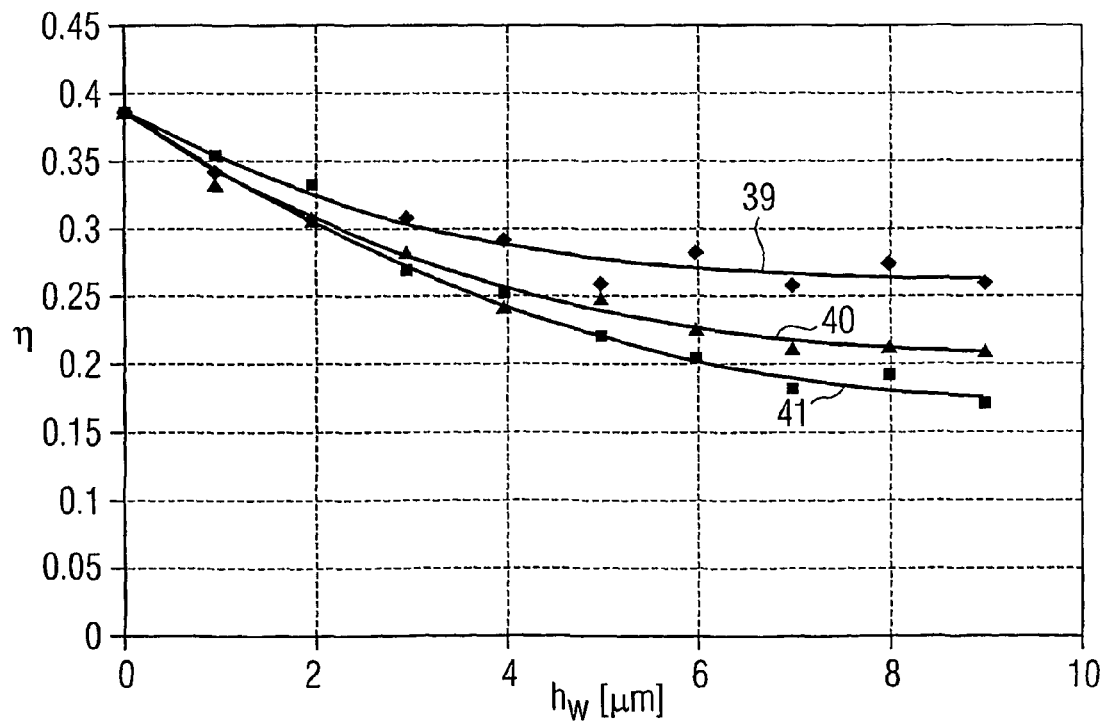
FIG. 14 is a graph that shows the dependency of the output efficiency on the thickness of a cover layer connecting the mesas for different profiles of the mesas.

The thickness of the cover layer 5 is also of significance for the output efficiency η. In FIG. 14, the output efficiency η is entered dependent on the thickness hw of the cover layer 5 for various cases. A curve 39 reflects the aforementioned periodic case. A further curve 40 relates to the aperiodic case and a third curve 41 refers to a case wherein quadratic semiconductor chips having an edge length of 300 μm are connected to one another by a connecting layer. One can see from FIG. 14 that the cover layer 5 is increasingly advantageous with increasing layer thickness. In particular, it is advantageous when the layer thickness $h_w$ is smaller than the height of the mesas 4, this amounting to 6 μm in the present case. It follows that the depth of the cavities 8 should be greater than half the thickness of the active thin-film layer 2.

However, it also proceeds from FIG. 14 that a plurality of individual semiconductor chips that respectively comprise a mesa 4 represent the best case, since the output efficiency is highest given the thickness $h_w$=0. Individual chips, however, have the disadvantage that their power cannot be arbitrarily increased since the dimensions of the semiconductor chips must also be scaled with the power. For practical reasons, however, the thickness of epitaxial layers is limited. This results in that individual semiconductor chips cannot be designed for arbitrarily high powers. The semiconductor chips presented in FIGS. 1 through 4, however, can be nearly arbitrarily scaled, since the number of mesas 4 merely has to be increased corresponding to the increasing area of the cover layer 5 in order to raise the light power of the semiconductor chip.

A further investigation was directed to the question of whether the active zone 3 might not also be arranged in the cover layer 3. To that end, the output efficiency for a traditional thin-film light-emitting diode was calculated and this was set equal to 1. A semiconductor chip with the active zone 3 in the cover layer 5 has an output efficiency of 1.25 compared to the traditional thin-film light-emitting diodes. Finally, a relative output efficiency of 1.67 derived for the semiconductor chips shown in FIGS. 1 through 4. This shows that a boost of the output efficiency η can also be achieved when the active zone 3 is arranged in the cover layer 5.

Figure 15:
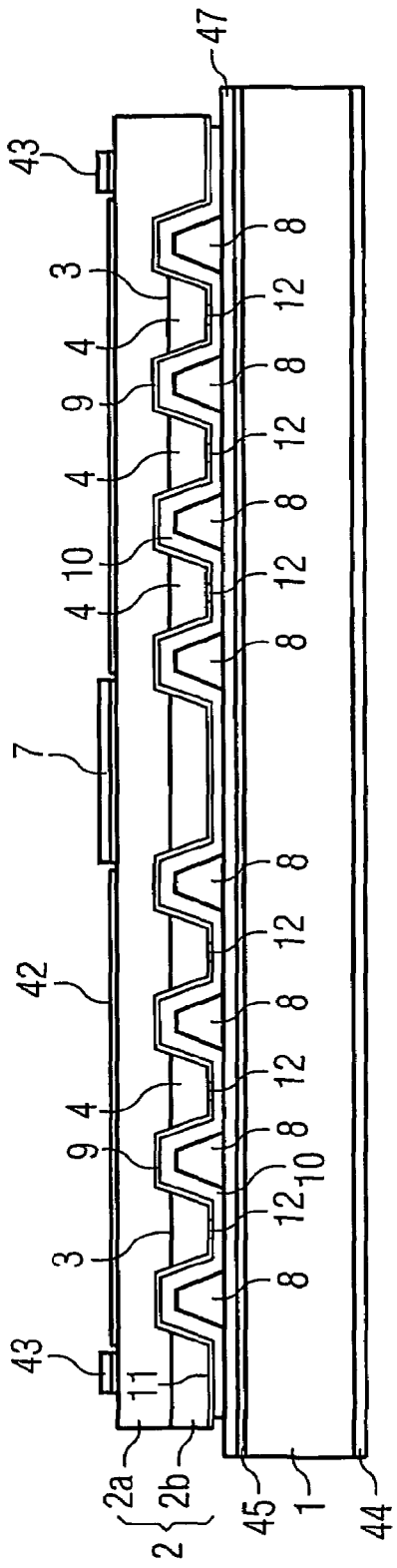
FIG. 15 is a schematic illustration of a cross-section through a further exemplary embodiment of a semiconductor according to the invention.

FIG. 15 shows a preferred development of an inventive thin-film light-emitting diode in a schematic illustration. The thin-film layer 2 is composed of an n-InGaAlP layer 2a highly doped with Te (concentration $>10^{17}$ cm$^{-3}$, preferably $>10^{18}$ cm$^{-3}$) with a layer thickness of about 4 μm and an Mg-doped p-GaP layer 2b with a layer thickness of about 3.5 μm.

As described in conjunction with FIG. 1, an insulating layer 9, for example of $Si_3N_4$, and a metallic reflector contact layer 10 are applied on the fastening side 11 of the thin-film layer 2 facing toward the carrier substrate 1. The $Si_3N_4$ layer, which comprises a thickness of preferably approximately three wavelengths of the emitted radiation with reference to the wavelength of the light emitted by the active zone, also leads—in addition to its electrically insulating effect—to an improved mirror effect of the metallic reflector and simultaneously represents a diffusion barrier between thin-film layer 2 and metallic reflector layer 10 given employment of a suitable material.

Alternatively, the insulating layer can be a layer stack of, for example, silicon nitride layers and silicon oxide layers in alternation.

The p-side current feed to the active zone 3 is assured by AuZn contacts 12 that are alloyed in and that are arranged at that surface of the mesas 4 facing toward the carrier substrate 1 and that are conducted through the insulating layer 9.

Preferably, the reflector contact layer 10 is an AuZn/TiW (N)/Au layer. However, it can also be made completely of Au, Al or Ag or an alloy of these metals.

In order to achieve an adequate mechanical stability, the thin-film layer 2 is applied by bonding onto the conductive carrier substrate, an n-GaAs substrate in the exemplary embodiment. The upper-side and under-side of the carrier substrate 1 are provided, for example, with AuGe contact layers 44, 45. Additionally, a TiPtAu/AuSn layer 47 is situated, for example, on the AuGe contact layer 45 at that side facing toward the thin-film layer 2.

A middle contact 7 and a metal frame 43 or some other electrically conductive frame that is connected to the middle contact 7 via two electrically conductive webs (not shown) is provided at the front or output side of the chip. The middle contact 7 and the metal frame 43 are composed, for example, of a TiPtAu layer and of a TiAuGe layer arranged between the former and the thin-film layer 2.

The high conductivity of the n-InGaAlP layers assures the required current divergence. The current feed to the p-side of the active zone 3 ensues via the contact layer 44 at the underside of the carrier substrate 1 and through the latter.

For further improvement of the light output, an optical anti-reflection coating 42 is arranged on the front side of the thin-film layer 2, a λ/4 layer of $Si_3N_4$ in the exemplary embodiment.

As already described in conjunction with FIG. 2, a plurality of cavities 8 shaped like a truncated pyramid are fashioned in the thin-film layer 2 proceeding from the connecting plane between carrier substrate and thin-film layer 2, these cavities 8 noticeably increasing the light output of the light-emitting diode. In the exemplary embodiment, the cavities 8 extend so far into the thin-film layer 2 that they interrupt the pn-junction 3. The cavities 8, however, can be fashioned only so deep that the do not part the pn-junction.

In addition to increasing the light output, the cavities 8 have the additional advantage that they substantially dismantle the stresses that occur in the eutectic bonding of the thin-film layer 2 onto the carrier substrate due to the different coefficients of thermal expansion of the various materials. The process dependability and the fabrication yield are thus enhanced.

The same is true of the compensation of mechanical stresses occurring during operation of the semiconductor chip due to different thermal expansions given temperature increase due to dissipated power.

Figure 16:
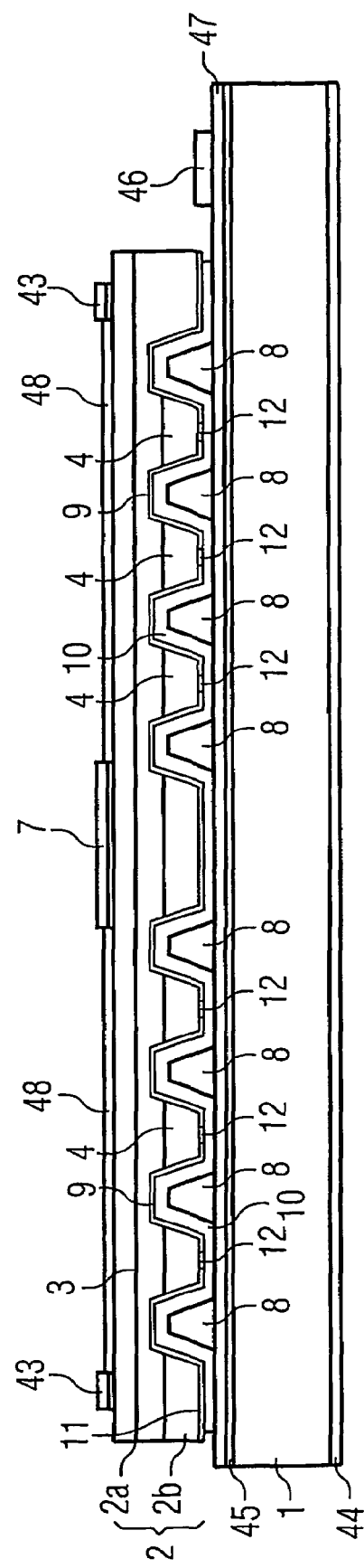
FIG. 16 is a schematic illustration of a cross-section through a further exemplary embodiment of a semiconductor chip according to the invention.
Figure 19A:
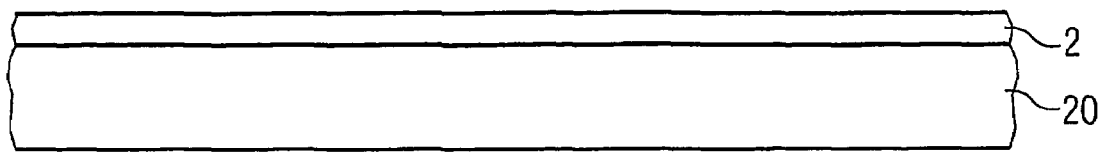
FIGS. 19a–19e is a schematic illustration of sequence of a third method for the manufacture of a plurality of semiconductor chips according to the invention.
Figure 19B:
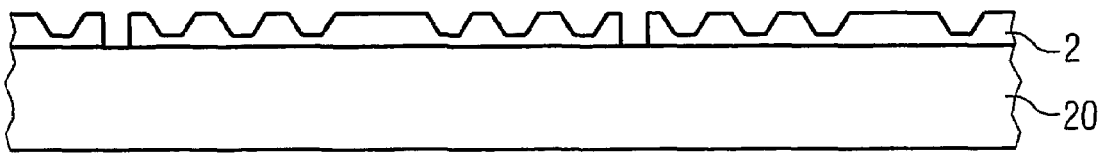
Figure 19C:
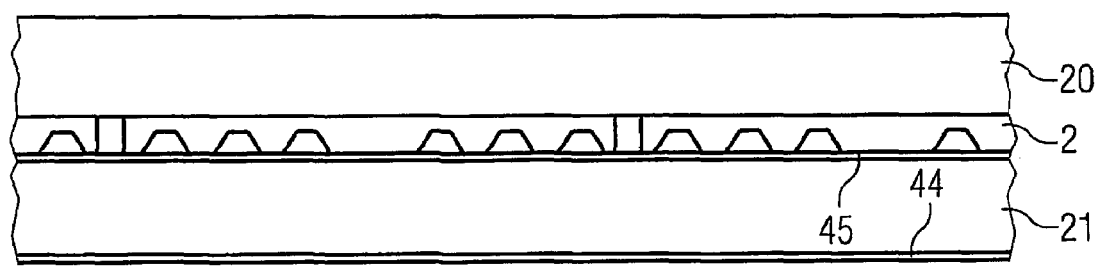
Figure 19D:
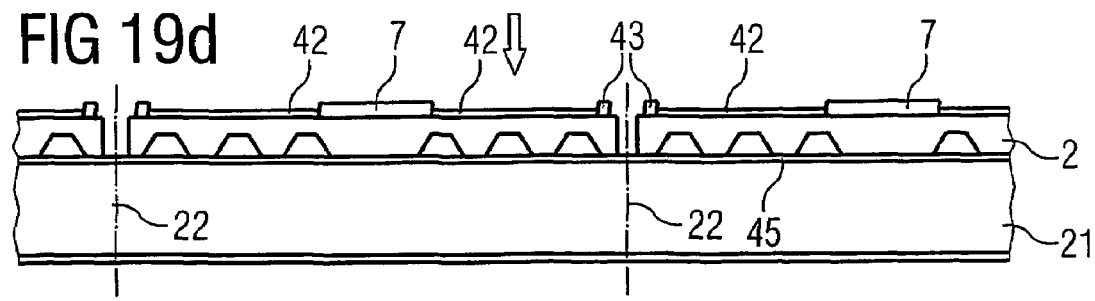
Figure 19E:
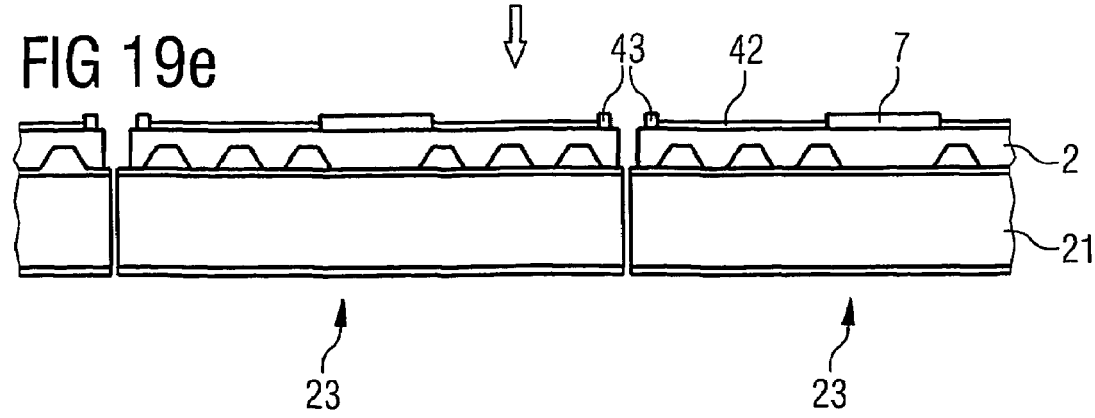

FIG. 16 shows a further semiconductor chip of the invention in a schematic illustration. In this embodiment, the thin-film layer 2 is applied on an electrically insulating carrier substrate 1, so that the feed of current to the p-side of the pn-junction 3 ensues via a p-contact arranged on the Au—Ge contact layer 45 next to the thin-film layer 2.

The p-InGaAlP layer 2b comprises a thickness of 6 µm; the n-InGaAlP:Te layer 2a doped with $1\times10^{18}$ cm$^{-3}$ comprises a thickness of 3 µm. In this embodiment, the cavities 8 extend into a depth of 5.5 µm. They thus do not interrupt the pn-junction 3 in this embodiment.

In this embodiment, for example, an optical anti-reflection layer 48 of conductive indium-tin-oxide is applied on the front side of the thin-film layer 2 facing away from the carrier substrate 1, this layer 48 also contributing to the current divergence in addition to improving the light output. Consequently, the n-layer 2a here can potentially be implemented thinner than given employment of an electrically insulating anti-reflection layer because the current divergence then need not ensue exclusively in the thin-film layer 2.

Such an electrically conductive anti-reflection layer 48 can also be utilized in all other embodiments of the inventive semiconductor chip. In the exemplary embodiment of FIG. 16, likewise, an insulating anti-reflection layer 42 can be utilized instead of the indium-tin-oxide layer 48.

The structure shown in FIG. 16 is also suitable given employment of a conductive carrier substrate 1 and is not limited to the employment of an electrically insulating carrier substrate 1.

The structure of the embodiment of FIG. 16 has the advantage that the carrier substrate 1 can be advantageously optimized particularly in view of thermal expansion and/or thermal conductivity without having to pay attention to its electrical conductivity.

As needed, the cavities 8 can be filled with a suitable material for the processing of the thin-film layer.

The method execution illustrated in FIGS. 17a through 17e for the simultaneous manufacture of a plurality of inventive semiconductor chips shows schematic illustrations of perpendicular sections through a wafer at different points in time of the manufacturing method. For the sake of simplicity, a detailed illustration is omitted of, in particular, the active thin-film layer 2 as well as of the previously mentioned layers between the carrier substrate and the thin-film layer in terms of all of their details, here as well as in the descriptions of the methods of FIGS. 18a through 19e.

The thin-film layer 2, the insulating layer 9, the contact layers 7, 43–47 and 49 and the anti-reflection layer 42, 48, for example, are manufactured with traditional deposition methods known from semiconductor technology.

In a first sub-process, an active thin-film layer 2 is grown onto a growth substrate 20 (FIG. 17a). As explained farther above, such a thin-film layer 2 usually comprises a plurality of semiconductor layers having different compositions.

Subsequently, the cavities 8 are formed in the thin-film layer 2 for generating the mesas 4 in the regions in which the light generation is to ensue later in the semiconductor chips. This ensues, for example, by using a suitable mask technique and anisotropic wet-chemical etching (FIG. 17b).

At that side of the thin-film layer 2 provided with the cavities 8, the reflection layer 9, 10 (see, e.g., FIGS. 15 and 16) is then applied and the through-contactings 12 (see, e.g., FIGS. 15 and 16) are produced at the mesas 4 before this side is subsequently connected to a carrier substrate wafer 21 on whose principal faces contact layers 44, 45 are preferably situated (FIG. 17c).

After at least partial, preferably complete removal of the growth substrate 20, a bond pad 7 to which a power supply frame 43 is connected via terminal webs (see FIG. 20) is applied onto the uncovered surface of the thin-film layer 2 in every surface region in which a semiconductor chip is to be created, this frame 43 proceeding at the outer edge of the thin-film layer 2 of the later chip. Exemplary materials of such contact layers have already been cited above. The radiation output faces of the later chips that are situated between the bond pads 7 and the contacting frame 70 are provided with an optical anti-reflection coat 42. See FIG. 17d.

Before the separation of the wafer processed in this way, the thin-film layer 2 is parted, preferably by etching, along the parting paths 22, and a damage etching is implemented as warranted at the sidewalls of the thin-film layer that arise from this. If necessary, the sidewalls of the thin-film layer 2 can be provided with an anti-reflection layer and/or a passivation layer.

After this step, the carrier substrate wafer 21 is then parted, for example by sawing or scoring and breaking along the parting paths 22, so that individual semiconductor chips 23 arise.

The complete manufacture of the semiconductor chips consequently advantageously ensues in the wafer union; i.e., the separation of the wafer into individual chips is the last step of the process before, for example, the chips are mounted in a housing at a later point in time.

The method shown in FIGS. 18a through 18e differs from that of FIGS. 17a–17e primarily in that the separate parting of the thin-film layer 2 before the parting of the carrier substrate wafer 21 is omitted, and the parting of the thin-film layer 2 together with the parting of the carrier substrate wafer 21 ensues in one step along the parting lines 22.

The method illustrated in FIGS. 19a through 19e differs from that of FIGS. 17a–17e primarily in that the separate parting of the thin-film layer 2 ensues before the joining of the thin-film layer 2 to the carrier substrate wafer 21.

Instead of ensuing via grinding and/or wet-chemical etching, the removal of the growth substrate can also ensue by pop-off. To this end, an absorbent layer that has a smaller band gap than the growth substrate is preferably introduced between the thin-film layer and the growth substrate. The absorbent layer is destroyed by use of a laser having a suitable wavelength that passes through the growth substrate. Given a growth substrate of GaAs, the absorbent layer is composed, for example, of InGaAs and the laser, for example, is an IR laser.

Figure 20:
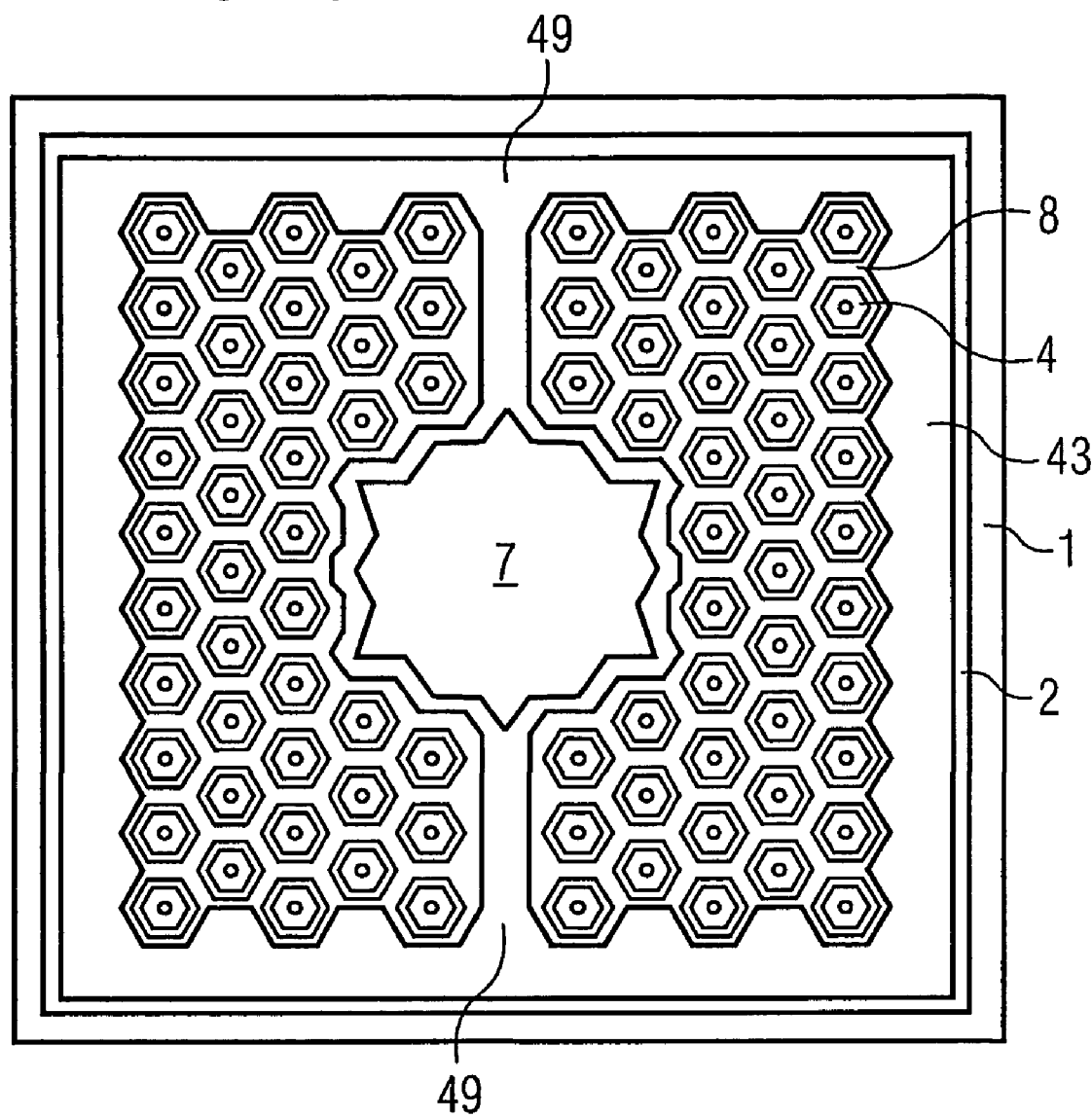
FIG. 20 is a face view of a semiconductor chip according to the invention from above.

The mesas 4 generated by way of cavities 8 are visible in the view of an inventive chip from above that is shown in FIG. 20. What can be particularly seen is that no cavities 8 are present in the regions of the contact 7, of the connecting webs 49, of the power supply frame 43, and of the parting tracks. These are all regions in which little or no radiation would be coupled out anyway. The omission of the cavities in these regions advantageously leads to a clear mechanical stabilization of the thin-film layer 2. This has a positive effect particularly in the region of the contact 7 because a bond wire is usually put in place and pressed on there when the semiconductor chip is mounted in a housing.

Figure 21:
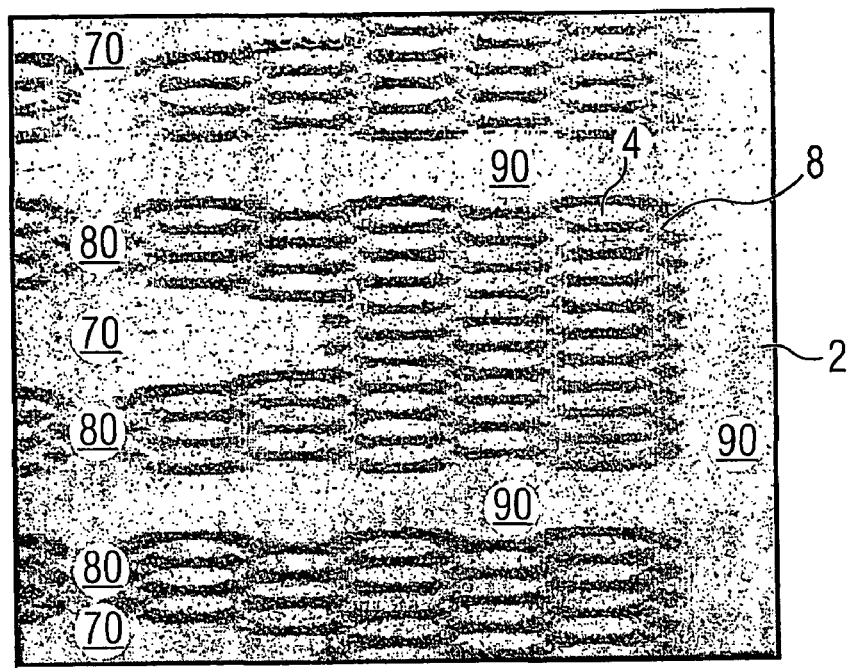
FIG. 21 is an image of an oblique view of a surface of a thin-film layer after the generation of cavities.

FIG. 21 shows an image of an oblique view of a surface of a thin-film layer 2 after generating the cavities 8. Here, too, it can be seen that no mesas 4 are present in the regions of the terminal webs 49 and in the regions 90 of the power supply frame 43.

Figure 22:
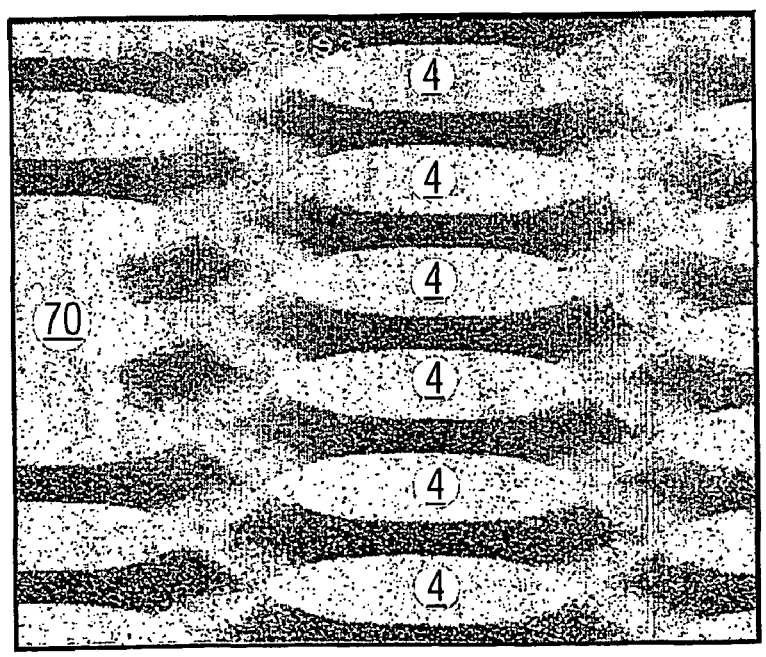
FIG. 22 is a magnified portion of the image of FIG. 21.

FIG. 22 shows an enlarged excerpt from FIG. 21.

For the purposes of promoting an understanding of the principles of the invention, reference has been made to the preferred embodiments illustrated in the drawings, and specific language has been used to describe these embodiments. However, no limitation of the scope of the invention is intended by this specific language, and the invention should be construed to encompass all embodiments that would normally occur to one of ordinary skill in the art.

The present invention may be described in terms of functional block components and various processing steps. Such functional blocks may be realized by any number of hardware and/or software components configured to perform the specified functions. For example, the present invention may employ various integrated circuit components. Furthermore, the present invention could employ any number of conventional techniques for electronics configuration.

The particular implementations shown and described herein are illustrative examples of the invention and are not intended to otherwise limit the scope of the invention in any way. For the sake of brevity, conventional electronics and other functional aspects of the device may not be described in detail. Furthermore, the connecting lines, or connectors shown in the various figures presented are intended to represent exemplary functional relationships and/or physical or logical couplings between the various elements. It should be noted that many alternative or additional functional relationships, physical connections or logical connections may be present in a practical device. Moreover, no item or component is essential to the practice of the invention unless the element is specifically described as "essential" or "critical". Numerous modifications and adaptations will be readily apparent to those skilled in this art without departing from the spirit and scope of the present invention.

What is claimed is:

1. A semiconductor chip for a radiation-emitting optoelectronics component, comprising:
    an active thin-film layer comprising a multitude of epitaxial semiconductor layers, including a photon-emitting (active) zone, said layer being free of a growth substrate;
    a carrier substrate arranged at a side of the thin-film layer that faces away from an emission direction and connected to the thin-film layer;
    at least one cavity; and
    a plurality of mesas formed by the at least one cavity; the plurality of mesas being fashioned in the thin-film layer at a side facing toward the carrier substrate.

2. The semiconductor chip according to claim 1, wherein a cross-section of the at least one cavity becomes smaller over its course away from the carrier substrate.

3. The semiconductor chip according to claim 1, wherein the active thin-film layer comprises a layer sequence of the basis of $In_{1-x-y}Al_xGa_yP$, wherein $0 \leq x \leq 1$, $0 \leq y \leq 1$, and $x+y \leq 1$.

4. The semiconductor chip according to claim 1, wherein the cavities are fashioned so deep that they part the active zone.

5. The semiconductor chip according to claim 1, wherein mesas are formed by a plurality of cavities only in those regions that represent radiation-generating regions of the thin-film layer.

6. The semiconductor chip according to claim 5, wherein the mesas taper toward the carrier substrate.

7. The semiconductor chip according to claim 6, wherein the mesas comprise concave lateral surfaces.

8. The semiconductor chip according to claim 1, wherein at least one cavity is configured such that at least one trajectory of photons emitted by the active zone leads from a respective mesa to a neighboring mesa.

9. The semiconductor chip according to claim 8, wherein the mesas taper toward the carrier substrate.

10. The semiconductor chip according to claim 9, wherein the mesas comprise concave lateral surfaces.

11. The semiconductor chip according to claim 5, wherein the mesas are fashioned in truncated pyramid shapes.

12. The semiconductor chip according claim 5, further comprising:
    a cover layer of the thin-film layer, said cover layer connecting the mesas, wherein the active zone is arranged in a half of the mesas neighboring the cover layer.

13. The semiconductor chip according to claim 5, wherein the cover layer comprises a material that is substantially transparent for photons emitted by the active zone.

14. The semiconductor chip according to claim 5, further comprising a cover layer that is highly doped.

15. The semiconductor chip according to claim 1, further comprising a reflection layer that covers the mesas.

16. The semiconductor chip according to claim 15, wherein the reflection layer comprises a metallization layer underlaid with an insulating layer.

17. The semiconductor chip according to claim 1, wherein the active thin-film layer is between 5 µm and 50 µm thick.

18. The semiconductor chip according to claim 1, wherein the active thin-film layer is between 5 µm and 25 µm thick.

19. The semiconductor chip according to claim 1, wherein a depth of the at least one cavity is greater than half of the thickness of the thin-film layer.

20. The semiconductor chip according to claim 1, further comprising:
    an electrical contact surface of the carrier substrate at a side facing away from the thin-film layer, the carrier substrate configured to be electrically conductive.

21. The semiconductor chip according to claim 1, further comprising:
    an electrical contact surface of the carrier substrate at a surface next to the thin-film layer at a side facing toward the thin-film layer, the carrier substrate being electrically insulating or electrically conductive.

22. The semiconductor chip according to claim 1, further comprising:
    an optical anti-reflection layer configured to provide improved light outfeed, the anti-reflection layer being provided on a surface of the thin-film layer that lies opposite a fastening side.

23. The semiconductor chip according to claim 22, wherein the optical anti-reflection layer is formed of silicon nitride.

24. The semiconductor chip according to claim 22, wherein the optical anti-reflection layer is formed of conductive indium-tin-oxide.

25. The semiconductor chip according to claim 1, further comprising:
one or more contact locations, wherein the thin-film layer comprises no cavity in the region opposite the one or more contact locations.

26. The semiconductor chip according to claim 1, wherein the mesas taper in a direction toward the carrier substrate.

27. The semiconductor chip according to claim 26, wherein the mesas have a truncated pyramid or conoidal frustum shape and side faces of the mesas are inclined relative to a direction of extent of the thin-film layer by an angle $\phi$ of between 5° and 60°.

28. The semiconductor chip according to claim 27, wherein the mesas have a truncated pyramid or conoidal frustum shape and side faces of the mesas are inclined relative to a direction of extent of the thin-film layer by an angle $\phi$ of between 10° and 40°.

29. The semiconductor chip according to claim 27, wherein the angle $\phi$ lies between 15° and 30°.

30. A method for a simultaneous manufacture of a plurality of semiconductor chips for optoelectronics having an active thin-film layer in which an active zone that emits photons is formed, comprising:
epitaxially growing a layer sequence on a growth substrate wafer, the layer sequence containing a zone that emits the photons;
fashioning at least one cavity in the layer sequence such that a plurality of mesas arise in the layer sequence;
applying the growth substrate wafer together with the layer sequence onto a carrier substrate such that the mesas face toward the carrier substrate;
connecting the layer sequence to the carrier substrate wafer;
separating the carrier substrate together with the layer sequence along parting tracks to form semiconductor chips;
wherein the layer sequence is separated along the parting tracks before the layer sequence is connected to the carrier substrate wafer; and
wherein the layer sequence is separated along the parting tracks in a separate step after removal of the growth substrate wafer and before the carrier substrate is separated.

31. The method according to claim 30, wherein the connecting of the layer sequence to the carrier substrate wafer comprises soldering or gluing.

* * * * *